(12) United States Patent
Lee et al.

(10) Patent No.: US 11,804,477 B2
(45) Date of Patent: Oct. 31, 2023

(54) SEMICONDUCTOR DEVICE HAVING PACKAGE ON PACKAGE STRUCTURE AND METHOD OF MANUFACTURING THE SEMICONDUCTOR DEVICE

(71) Applicant: Samsung Electronics Co., Ltd., Suwon-si (KR)

(72) Inventors: Jeonghyun Lee, Seoul (KR); Jihwang Kim, Cheonan-si (KR); Jongbo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 17/371,834

(22) Filed: Jul. 9, 2021

(65) Prior Publication Data

US 2022/0181309 A1    Jun. 9, 2022

(30) Foreign Application Priority Data

Dec. 8, 2020 (KR) .......................... 10-2020-0170751

(51) Int. Cl.
*H01L 25/10* (2006.01)
*H01L 23/00* (2006.01)
(Continued)

(52) U.S. Cl.
CPC .......... *H01L 25/105* (2013.01); *H01L 21/565* (2013.01); *H01L 23/3128* (2013.01);
(Continued)

(58) Field of Classification Search
CPC ... H01L 25/105; H01L 25/0657; H01L 25/50; H01L 25/10; H01L 21/565;
(Continued)

(56) References Cited

U.S. PATENT DOCUMENTS 3,084,850 A1   12/2011   Shin
9,913,385 B2   3/2018   Lin et al.
(Continued)

FOREIGN PATENT DOCUMENTS

KR   1020130007049 A   1/2013
KR   102104060 B1   4/2020

*Primary Examiner* — Jasmine J Clark
(74) *Attorney, Agent, or Firm* — Muir Patent Law, PLLC

(57) ABSTRACT

A semiconductor device having a package on package (PoP) structure, in which a fine pitch between package substrates is implemented, a total height of a package is reduced, and reliability is enhanced. The semiconductor package includes a first package substrate including a first body layer and a first passivation layer, a first semiconductor chip on the first package substrate, a second package substrate on the first package substrate, the second package substrate including a second body layer and a second passivation layer, a first connection member on the first package substrate outside the first semiconductor chip, and a gap filler filled between the first package substrate and the second package substrate, wherein the first package substrate includes a first trench, the second package substrate includes a second trench, and the first semiconductor chip is disposed between the first trench and the second trench.

20 Claims, 20 Drawing Sheets

(51) Int. Cl.
*H01L 23/498* (2006.01)
*H01L 21/56* (2006.01)
*H01L 23/31* (2006.01)

(52) U.S. Cl.
CPC ...... *H01L 23/3142* (2013.01); *H01L 23/3171* (2013.01); *H01L 23/49816* (2013.01); *H01L 23/49822* (2013.01); *H01L 23/49838* (2013.01); *H01L 24/16* (2013.01); *H01L 24/32* (2013.01); *H01L 24/73* (2013.01); *H01L 2224/16155* (2013.01); *H01L 2224/32145* (2013.01); *H01L 2224/73204* (2013.01); *H01L 2225/1023* (2013.01); *H01L 2225/1041* (2013.01); *H01L 2225/1058* (2013.01); *H01L 2924/1431* (2013.01); *H01L 2924/1436* (2013.01); *H01L 2924/1437* (2013.01); *H01L 2924/1438* (2013.01); *H01L 2924/182* (2013.01); *H01L 2924/186* (2013.01)

(58) Field of Classification Search
CPC ............. H01L 23/3128; H01L 23/3142; H01L 23/3171; H01L 23/49816; H01L 23/49822; H01L 23/49838; H01L 23/3114; H01L 23/13; H01L 23/29; H01L 23/31; H01L 24/14; H01L 24/16; H01L 24/17; H01L 24/73; H01L 2224/16155; H01L 2224/32145; H01L 2224/72304; H01L 2225/1058; H01L 2225/06517; H01L 2225/0652; H01L 2924/1431; H01L 2924/1436; H01L 2924/1437; H01L 2924/1438; H01L 2924/182; H01L 2924/186; H01L 2924/15311; H01L 2924/181; H01L 2924/19105; H01L 24/32; H10B 80/00

See application file for complete search history.

(56) References Cited

U.S. PATENT DOCUMENTS

| | | |
|---|---|---|
| 10,177,090 B2 | 1/2019 | Lin et al. |
| 2013/0001797 A1 | 1/2013 | Choi et al. |
| 2014/0319701 A1 | 10/2014 | Kim et al. |
| 2015/0221570 A1 | 8/2015 | Berry et al. |
| 2016/0318756 A1 | 11/2016 | Shih et al. |
| 2022/0059514 A1* | 2/2022 | Lee ........................ H01L 25/105 |
| 2022/0068904 A1* | 3/2022 | Park ........................ H01L 25/50 |

* cited by examiner

SEMICONDUCTOR DEVICE HAVING PACKAGE ON PACKAGE STRUCTURE AND METHOD OF MANUFACTURING THE SEMICONDUCTOR DEVICE

CROSS-REFERENCE TO RELATED APPLICATION

This application claims priority under 35 U.S.C. § 119 to Korean Patent Application No. 10-2020-0170751, filed on Dec. 8, 2020, in the Korean Intellectual Property Office, the disclosure of which is incorporated by reference herein in its entirety.

BACKGROUND

The inventive concept relates to a semiconductor package, and more particularly, to a semiconductor package having a package on package (PoP) structure and a method of manufacturing the semiconductor package.

As the electronic industry advances rapidly to meet the demands of users, electronic devices are being more and more miniaturized and lightweight. As electronic devices are miniaturized and lightweight, semiconductor packages are being miniaturized and made lightweight, and moreover, need high performance, large capacity, and high reliability. For small, lightweight, high performance, large capacity, and high reliability electronic devices, semiconductor packages having a PoP structure, where a package is disposed on another package, are being continuously researched and developed.

SUMMARY

The inventive concept provides a semiconductor device having a package on package (PoP) structure, in which a fine pitch between package substrates is implemented, a total height of a package is reduced, and reliability is enhanced, and a method of manufacturing the semiconductor package.

According to an aspect of the inventive concept, there is provided a semiconductor device having a package on package (PoP) structure, the semiconductor package including a first package substrate including a first body layer and a first passivation layer on a top surface of the first body layer, a first semiconductor chip mounted on the first package substrate, a second package substrate disposed on the first package substrate and the first semiconductor chip, the second package substrate including a second body layer and a second passivation layer on a bottom surface of the second body layer, first connection members disposed on the first package substrate outside the first semiconductor chip to electrically connect the first package substrate to the second package substrate, and a gap filler filled between the first package substrate and the second package substrate and surrounding at least some of portions of the first connection members. The first package substrate includes a first trench formed by removing a center portion of the first passivation layer, the second package substrate includes a second trench formed by removing a center portion of the second passivation layer, and the first semiconductor chip is disposed between the first trench and the second trench.

According to an aspect of the inventive concept, there is provided a semiconductor device having a package on package (PoP) structure, the semiconductor device including a first package substrate including a first body layer, a first upper passivation layer on a top surface of the first body layer, and a first lower passivation layer on a bottom surface of the first body layer, and a first trench formed at a center portion of the first upper passivation layer on the top surface of the first body layer, a second package substrate disposed on the first package substrate, the second package substrate including a second body layer, a second upper passivation layer on a top surface of the second body layer, and a second lower passivation layer on a bottom surface of the second body layer, and a second trench formed at a center portion of the second lower passivation layer on the bottom surface of the second body layer, a first semiconductor chip mounted on a top surface of the first package substrate and disposed in a space between a first region of the first package substrate where the first trench is formed and a second region of the second package substrate where the second trench is formed, and an upper package mounted on a top surface of the second package substrate, the upper package including a second semiconductor chip, an epoxy molding compound (EMC) covering the first semiconductor chip and filling at least a portion of each of the first trench and the second trench, and a gap filler including a material which differs from the EMC and filling at least a portion between the first upper passivation layer of the first package substrate and the second lower passivation layer of the second package substrate.

According to an aspect of the inventive concept, there is provided a method of manufacturing a semiconductor device having a package on package (PoP) structure, the method including preparing a first package substrate and a second package substrate, forming a first trench at a top surface of the first package substrate and forming a second trench at a bottom surface of the second package substrate, placing a first semiconductor chip on a first region of the first package substrate where the first trench is formed, stacking the second package substrate on the first package substrate so that the first semiconductor chip is disposed in a space between the first region of the first package substrate and a second region of the second package substrate where the second trench is formed, sealing the first semiconductor chip using an epoxy molding compound (EMC), and mounting an upper package on the second package substrate. The stacking of the second package substrate on the first package substrate includes bonding the second package substrate to the first package substrate by using first connection members and a gap filler including a material which differs from the EMC.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
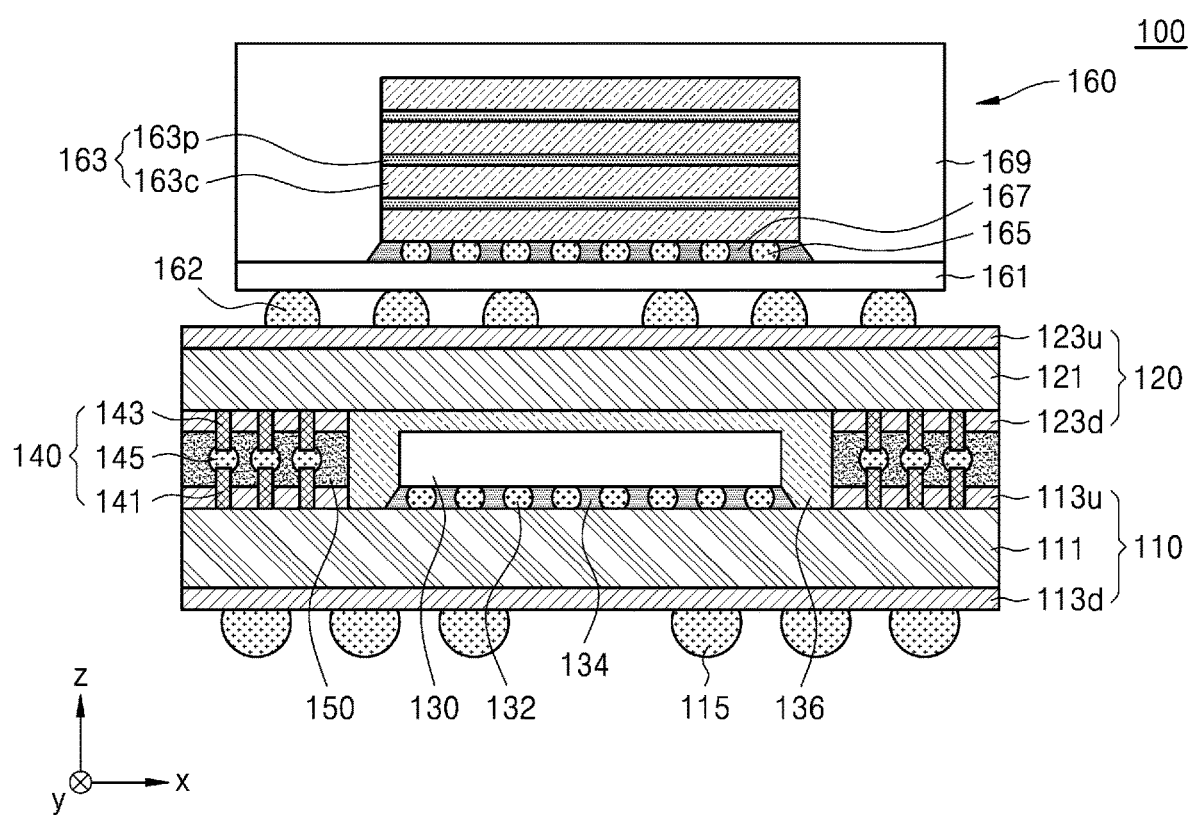
FIG. 1 is a cross-sectional view of a semiconductor package having a package on package (PoP) structure according to an embodiment.
Figure 2A:
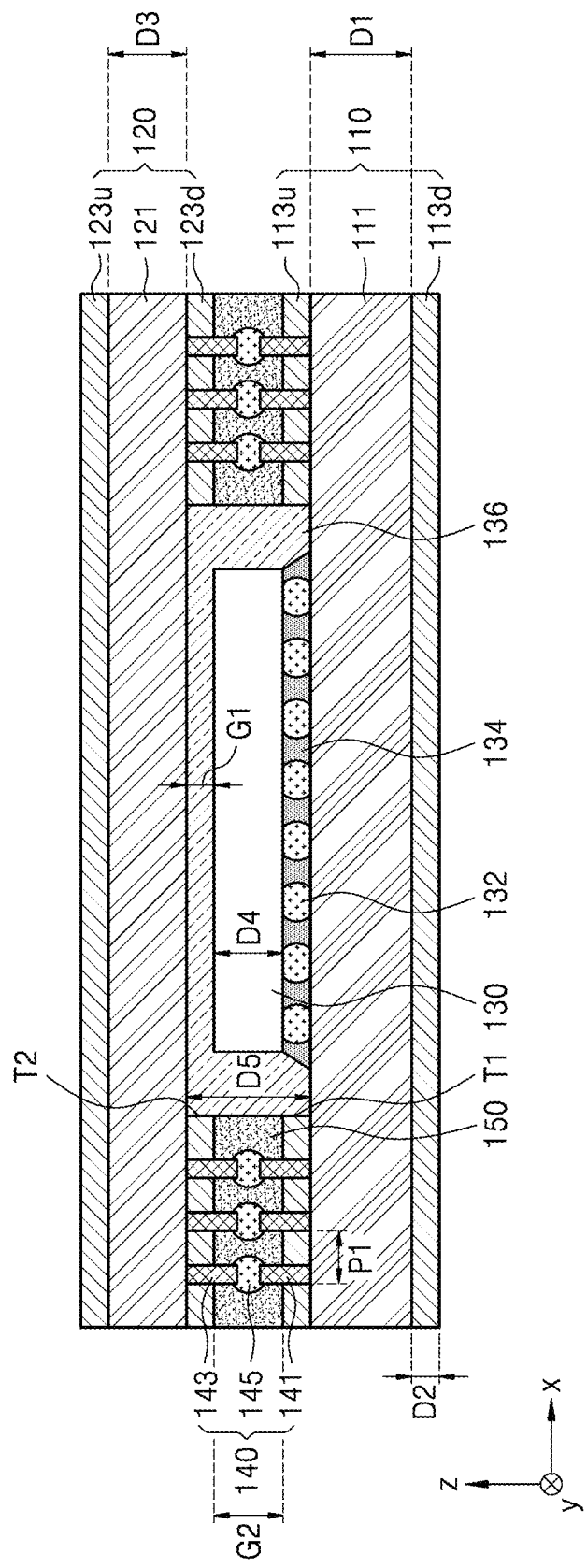
FIGS. 2A to 2C are a cross-sectional view, a perspective view, and a plan view illustrating a stack structure of package substrates and a structure of a package substrate, in the semiconductor package of FIG. 1.
Figure 2B:
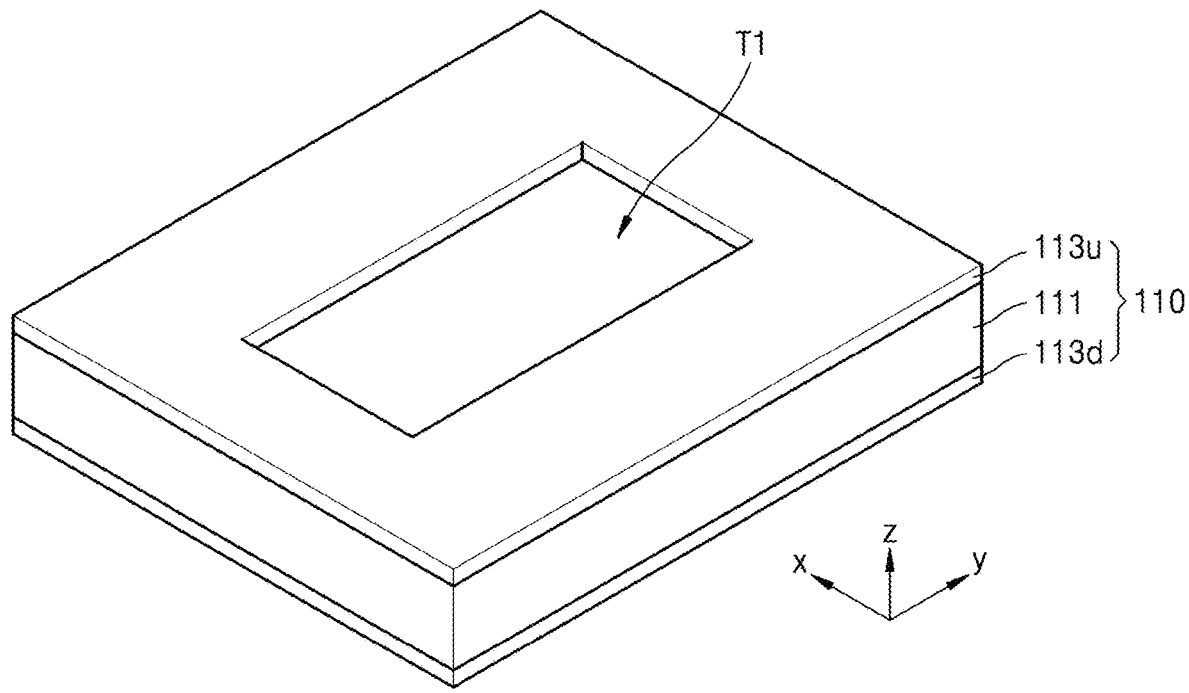
Figure 2C:
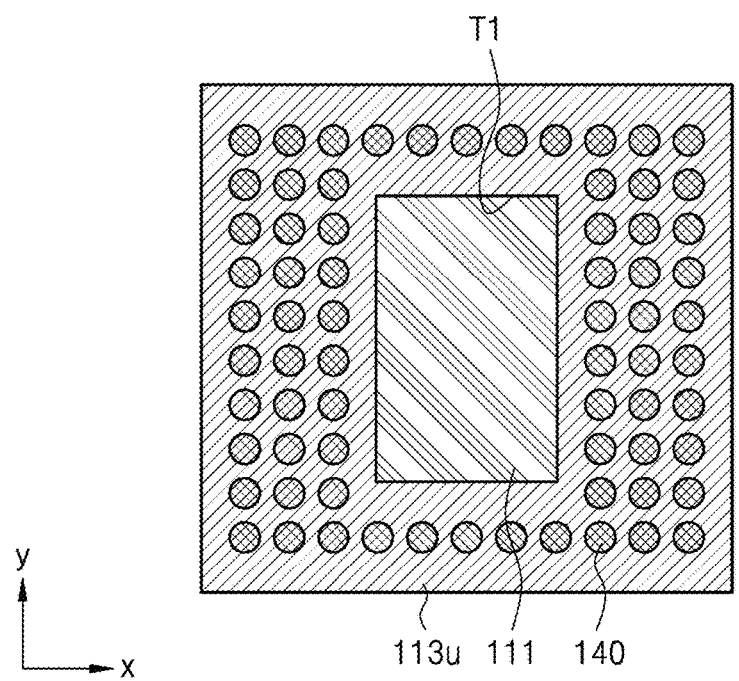
Figure 3A:
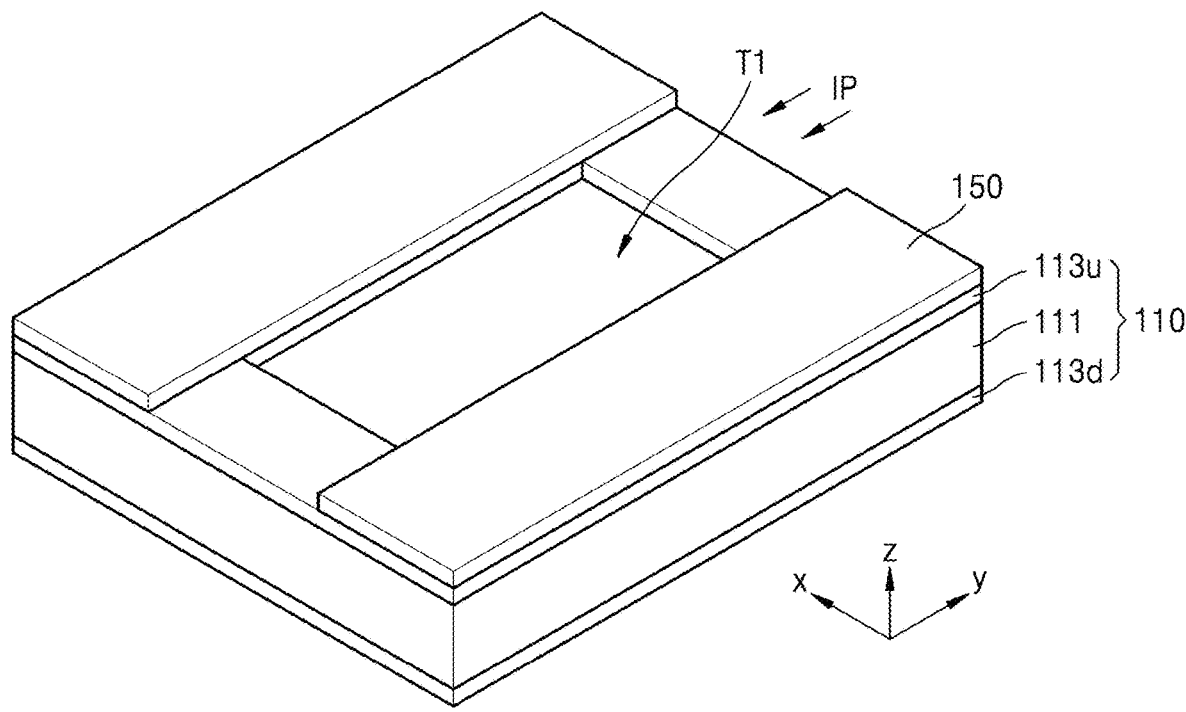
FIGS. 3A and 3B are a perspective view and a plan view illustrating a structure of a gap filler, in the semiconductor package of FIG. 1.
Figure 3B:
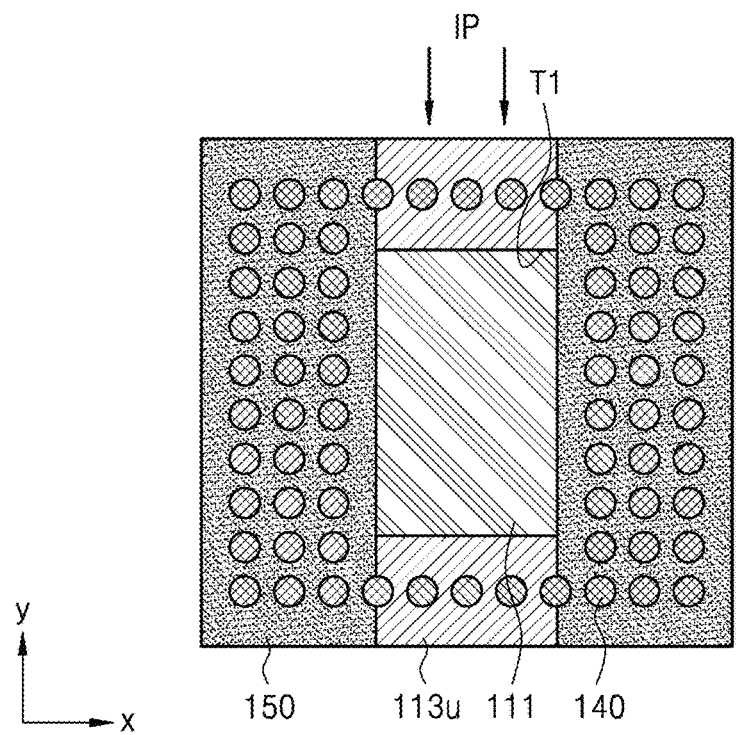

FIG. 1 is a cross-sectional view of a semiconductor package having a package on package (PoP) structure according to an embodiment, FIGS. 2A to 2C are a cross-sectional view, a perspective view, and a plan view illustrating a stack structure of package substrates and a structure of a package substrate, in the semiconductor package of FIG. 1, and FIGS. 3A and 3B are a perspective view and a plan view illustrating a structure of a gap filler, in the semiconductor package of FIG. 1.

Referring to FIGS. 1 to 3B, a semiconductor package having a PoP structure (hereinafter simply referred to as a semiconductor package or a semiconductor device) 100 according to an embodiment may include a first package substrate 110, a second package substrate 120, a first semiconductor chip 130, a first connection member 140, a gap filler 150, and an upper package 160.

The first package substrate 110 may be a supporting substrate of the semiconductor package 100 and may include a first body layer 111, a lower passivation layer 113d, and an upper passivation layer 113u. The first body layer 111 may include a wiring of at least one layer therein. In a case where the wiring is formed of a multilayer, wirings of different layers may be connected to each other through a vertical contact. According to an embodiment, the first body layer 111 may include a through via which directly connects a substrate pad, disposed on a top surface thereof, to a substrate pad disposed on a bottom surface thereof. The first body layer 111 may be formed based on, for example, a ceramic substrate, a printed circuit board (PCB), a glass substrate, or an interposer substrate. According to an embodiment, the first body layer 111 may be formed based on an active wafer such as a silicon wafer. The first body layer 111 may have a first thickness D1. The first thickness D1 may be, for example, about 100 μm to about 200 μm. However, the first thickness D1 is not limited to this numerical range. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The lower passivation layer 113d may be disposed on the bottom surface of the first body layer 111, and the upper passivation layer 113u may be disposed on the top surface of the first body layer 111. The lower passivation layer 113d and the upper passivation layer 113u may include or may be formed of, for example, solder resist (SR). However, a material of each of the lower passivation layer 113d and the upper passivation layer 113u is not limited to SR. Each of the lower passivation layer 113d and the upper passivation layer 113u may have a second thickness D2. The second thickness D2 may be, for example, about 10 μm to about 15 μm. However, the second thickness D2 is not limited to this numerical range.

A substrate pad may be formed on each of the bottom surface and the top surface of the first body layer 111, and a connection member may be disposed on the substrate pad. For example, an external connection member 115 such as a bump or a solder ball may be disposed on the bottom surface of the first body layer 111, and the first connection member 140 may be disposed on the top surface of the first body layer 111. In FIG. 1, although the external connection member 115 is illustrated as being disposed on the lower passivation layer 113d, the external connection member 115 may be electrically connected to the substrate pad on the bottom surface of the first body layer 111 through the lower passivation layer 113d. The first connection member 140 will be described below in more detail in describing the first connection member 140.

As seen in FIG. 2B, in the upper passivation layer 113u, a center portion thereof may be removed, and only an outer portion thereof may be maintained (i.e., remain) on the top surface of the first body layer 111. Based on a shape of the upper passivation layer 113u, the first package substrate 110 may include a first trench T1 in a top surface thereof. The first trench T1 may be formed by removing part of the upper passivation layer 113u, and thus, a depth of the first trench T1 may correspond to the second thickness D2 of the upper passivation layer 113u. For reference, for convenience of illustration, the first connection member 140 is omitted in FIG. 2B, and the first connection member 140 is illustrated in FIG. 2C.

The first semiconductor chip 130 may be disposed in the first trench T1, and thus, a width of the first trench T1 may be one which enables the first trench T1 to sufficiently accommodate the first semiconductor chip 130. For example, a width of the first trench T1 in a first direction (an x direction) and a width of the first trench T1 in a second direction (a y direction) may respectively be greater than a width of the first semiconductor chip 130 in the first direction (the x direction) and a width of the first semiconductor chip 130 in the second direction (the y direction). In some embodiments, the first semiconductor chip 130 may be disposed on a region of the first package substrate 110 where the first trench T1 is formed. Depending on a size of a third connection member 132 which is formed on a bottom surface of the first semiconductor chip 130, the bottom surface of the first semiconductor chip 130 may be lower or higher than a top surface of the upper passivation layer 113u.

The second package substrate 120 may be a supporting substrate of the upper package 160 and may include a second body layer 121, a lower passivation layer 123d, and an upper passivation layer 123u. In the semiconductor package 100 according to the present embodiment, the second package substrate 120 may be used for converting or transferring an input electrical signal between the first package substrate 110 and the upper package 160. Therefore, the second package substrate 120 may not include elements such as an active element or a passive element. In terms of an arrangement position and a function of the second package substrate 120, the second package substrate 120 may be referred to as an interposer. A PoP structure including an interposer may be referred to as an interposer PoP (iPoP).

The second body layer 121 may include or may be formed of, for example, one of silicon, an organic material, plastic, and glass. A material of the second body layer 121 is not limited to the materials. When the second body layer 121 includes or is formed of silicon, the second package substrate 120 may be referred to as a silicon interposer. For the second body layer 121 including or being formed of an organic material, the second package substrate 120 may be referred to as a panel interposer. In some embodiments, the number of panel interposers manufactured in a tetragonal disk including an organic material may be greater than the number of silicon interposers manufactured on one silicon wafer. For the second body layer 121 including or being formed of glass, the second package substrate 120 may be referred to as a glass interposer.

The second body layer 121 may include a wiring of at least one layer therein. In a case where the wiring is formed of a multilayer, wirings of different layers may be connected to each other through a vertical contact. According to an embodiment, the second body layer 121 may include a through via which directly connects a substrate pad, disposed on a top surface thereof, to a substrate pad disposed on a bottom surface thereof. According to an embodiment, the second body layer 121 may have a structure where a wiring layer is disposed at a lower portion thereof and a through via is disposed at an upper portion thereof. In such a structure, the through via may connect a substrate pad, disposed on the top surface of the second body layer 121, to a wiring of a wiring layer, and the wiring of the wiring layer may be connected to a substrate pad on the bottom surface of the second body layer 121. The second body layer 121 may have a third thickness D3. The third thickness D3 may be, for example, about 80 µm to about 150 µm. However, the third thickness D3 is not limited to this numerical range.

The lower passivation layer 123d may be disposed on the bottom surface of the second body layer 121, and the upper passivation layer 123u may be disposed on the top surface of the second body layer 121. The lower passivation layer 123d and the upper passivation layer 123u may include or may be formed of, for example, SR. However, a material of each of the lower passivation layer 123d and the upper passivation layer 123u is not limited to SR. The lower passivation layer 123d and the upper passivation layer 123u may each have substantially the same thickness as that of each of the lower passivation layer 113d and the upper passivation layer 113u. For example, each of the lower passivation layer 123d and the upper passivation layer 123u may have a second thickness D2 of about 10 µm to about 15 µm. However, the second thickness D2 is not limited to this numerical range.

A substrate pad may be formed on each of the bottom surface and the top surface of the second body layer 121, and a connection member may be disposed on the substrate pad. For example, the first connection member 140 may be disposed on the bottom surface of the second body layer 121, and a second connection member 162 may be disposed on the top surface of the second body layer 121. In FIG. 1, although the second connection member 162 is illustrated as being disposed on the upper passivation layer 123u, the second connection member 162 may be electrically connected to the substrate pad on the top surface of the second body layer 121 through the upper passivation layer 123u.

The second package substrate 120 may include a second trench T2 in a bottom surface thereof. The second trench T2 of the second package substrate 120 may be formed by removing a center portion of the lower passivation layer 123d. In FIG. 2B, the first trench T1 of the first package substrate 110 is illustrated, and in a case where a bottom surface of the second package substrate 120 is toward an upward direction, a shape of the second trench T2 of the second package substrate 120 may be substantially the same as that of the first trench T1 of the first package substrate 110. The second trench T2 may be formed by removing part of the lower passivation layer 123d, and thus, a depth of the second trench T2 may correspond to the second thickness D2 of the lower passivation layer 123d. The second trench T2 may have substantially the same area as that of the first trench T1, and moreover, may be formed in the bottom surface of the second body layer 121 at a position facing the first trench T1 with the first semiconductor chip 130 therebetween. In some embodiment, the first semiconductor chip 130 may be disposed between a region of the first package substrate 110 where the first trench T1 is formed and a region of the second package substrate 120 wherein the second trench T2 is formed.

The first semiconductor chip 130 may be mounted on a top surface of the first package substrate 110. The first semiconductor chip 130 may be, for example, a logic chip. Here, the logic chip may include an application processor (AP), a microprocessor, a central processing unit (CPU), a controller, or an application specific integrated circuit (ASIC). The first semiconductor chip 130 may have a fourth thickness D4. The fourth thickness D4 may be, for example, about 50 µm to about 150 µm. However, the fourth thickness D4 is not limited to this numerical range.

As illustrated in FIGS. 1 to 2A, the first semiconductor chip 130 may be disposed in the first trench T1 in the top surface of the first package substrate 110. In some embodiment, the first semiconductor chip 130 may be disposed on a region of the first package substrate 110 where the first trench T1 is formed. The first semiconductor chip 130 may be electrically connected to the first package substrate 110 through a third connection member 132, and an underfill 134 may be filled between the first semiconductor chip 130 and the first package substrate 110 and between third connection members 132. According to an embodiment, instead of the underfill 134, a first sealant 136 covering the first semiconductor chip 130 may be filled therein through a molded underfill (MUF) process.

The first semiconductor chip 130 may be sealed by the first sealant 136. The first sealant 136 may include or may be formed of, for example, a resin such as an epoxy molding compound (EMC). A material of the first sealant 136 is not limited to the EMC. The first sealant 136 may fill at least a portion of each of the first trench T1 and the second trench T2, cover a top surface and a side surface of the first semiconductor chip 130, and cover the underfill 134. The first sealant 136 may have a fifth thickness D5. The fifth thickness D5 may be, for example, about 100 µm to about 200 µm. However, the fifth thickness D5 is not limited to this numerical range.

A first gap G1 may be maintained between the first semiconductor chip 130 and the second package substrate 120. For example, a top surface of the first semiconductor chip 130 and a bottom surface of the second body layer 121, which is exposed by the second trench T2, of the second package substrate 120 may be spaced apart from each other at the first gap G1. A portion corresponding to the first gap G1 may be filled by the first sealant 136. The first gap G1 may be maintained between the first semiconductor chip 130 and the second package substrate 120, and the first gap G1 may be filled by the first sealant 136, and thus, warpage of the semiconductor package 100 may be prevented. For example, the first sealant 136 may decrease stress caused by a difference in an expansion rate (e.g., a thermal expansion coefficient) between the first package substrate 110, the second package substrate 120, and the first semiconductor chip 130. The first gap G1 may have, for example, a size equal to the second thickness D2 corresponding to a depth of the second trench T2. However, a size of the first gap G1 is not limited thereto. For example, the first gap G1 may be maintained in an appropriate size on the basis of reduction in a height of the semiconductor package 100 and the amount of warpage.

The first connection member 140 may be disposed between the first package substrate 110 and the second package substrate 120 and may electrically connect the first package substrate 110 to the second package substrate 120. As seen in FIG. 2C or 3B, the first connection member 140 may be disposed on the top surface of the first package substrate 110 outside the first semiconductor chip 130 or the first trench T1. In terms of the second package substrate 120, the first connection member 140 may be disposed on the bottom surface of the second package substrate 120 outside the first semiconductor chip 130 or the second trench T2.

The first connection member 140 may include a first pillar 141, a second pillar 143, and a solder 145. The first pillar 141 may be connected to the substrate pad on the top surface of the first package substrate 110, and the second pillar 143 may be connected to the substrate pad on the bottom surface of the second package substrate 120. Each of the first pillar 141 and the second pillar 143 may have a cylindrical pillar or a polygonal pillar shape such as a tetragonal pillar shape or an octagonal pillar shape, which passes through a corresponding passivation layer of the first and second passivation layers 113$u$ and 123$d$. Each of the first pillar 141 and the second pillar 143 may include or may be formed of, for example, nickel (Ni), copper (Cu), palladium (Pd), platinum (Pt), gold (Au), or a combination thereof. A material of each of the first pillar 141 and the second pillar 143 is not limited to these materials. In the semiconductor package 100 according to the present embodiment, each of the first pillar 141 and the second pillar 143 may include or may be formed of, for example, Cu.

The solder 145 may couple the first pillar 141 to the second pillar 143 and may have a spherical shape or a ball shape. The solder 145 may include or may be formed of, for example, tin (Sn), indium (In), bismuth (Bi), antimony (Sb), copper (Cu), silver (Ag), zinc (Zn), lead (Pb), and/or an alloy thereof. For example, the solder 145 may include or may be formed of Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn. However, a material of the solder 145 is not limited to these materials.

In the semiconductor package 100 according to the present embodiment, a plurality of first connection members 140 may be arranged at fine pitch. The plurality of first connection members 140 may be arranged at, for example, a fine pitch of about 30 μm to about 50 μm. According to an embodiment, the plurality of first connection members 140 may be arranged at a fine pitch of about 10 μm to about 30 μm. A fine pitch between the first connection members 140 will be described in more detail in describing an overall good characteristic of the semiconductor package 100 according to the present embodiment. A plurality of first connection members 140, as illustrated in FIGS. 2C and 3B, may be arranged in three columns at opposite sides in the first direction (the x direction) with the first semiconductor chip 130 therebetween and may be arranged in one row at opposite sides in the second direction (the y direction). However, the arrangement form of the first connection members 140 is not limited thereto.

The gap filler 150 may be disposed between the first package substrate 110 and the second package substrate 120 and between adjacent first connection members 140. The gap filler 150 may fill the second gap G2 between the first package substrate 110 and the second package substrate 120 at portions where the first connection members 140 are disposed. Here, the second gap G2 may correspond to a value obtained by subtracting a sum of the first and second trenches T1 and T2 from the fifth thickness D5 of the first sealant 136. For example, the gap filler 150 may fill a space between the upper passivation layer 113$u$ of the first package substrate 110 and the lower passivation layer 123$d$ of the second package substrate 120 and may surround at least some portions of the first connection members 140. The gap filler 150 may fill spaces between two adjacent first connection members 140.

As seen in FIGS. 3A and 3B, the gap filler 150 may be disposed on the upper passivation layer 113$u$ of the first package substrate 110 at opposite sides of the first semiconductor chip 130 or the first trench T1 in the first direction (the x direction) and may extend in the second direction (the y direction). For example, the gap filler 150 may have a rectangular shape, which is long in the second direction (the y direction). However, a shape of the gap filler 150 is not limited to a rectangular shape. Various shapes of the gap filler 150 will be described below in more detail with reference to FIGS. 4A to 4C. As illustrated in FIG. 2A or 3A, a width of the gap filler 150 in the first direction (the x direction) may be substantially the same as a width of the upper passivation layer 113$u$ in the first direction (the x direction), at opposite sides of the first trench T1 in the first direction (the x direction). However, according to an embodiment, a width of the gap filler 150 in the first direction (the x direction) may be less than a width of the upper passivation layer 113$u$ in the first direction (the x direction).

For reference, for convenience of illustration, the first connection member 140 is omitted in FIG. 3A, and the first connection member 140 is illustrated in FIG. 3B. The gap filler 150 is illustrated as being disposed on the upper passivation layer 113$u$ of the first package substrate 110, and according to some embodiments, the gap filler 150 may be illustrated as being disposed on the lower passivation layer 123$d$ of the second package substrate 120.

The gap filler 150 may not be disposed on the upper passivation layer 113$u$ of each of opposite end portions of the first package substrate 110, outside the first semiconductor chip 130 or the first trench T1 in the second direction (the y direction). Therefore, the opposite end portions of the first package substrate 110 may maintain an empty space. Each of the opposite end portions of the first package substrate 110 in the second direction may act as an injection path IP through which the first sealant 136 is injected. For example, the first semiconductor chip 130 may be mounted on the first package substrate 110 and the second package substrate 120 may be stacked on the first package substrate 110 through the first connection member 140 and the gap filler 150, and then, the first sealant 136 may seal the first semiconductor chip 130 by injecting the first sealant 136, such as an EMC, through the injection path IP of each of the opposite end portions of the first package substrate 110 in the second direction.

The gap filler 150 may include or may be formed of a material which differs from that of the first sealant 136. For example, the gap filler 150 may include or may be formed of a nonconductive film (NCF), a nonconductive paste (NCP), or SR. However, a material of the gap filler 150 is not limited thereto. The gap filler 150 may be formed prior to forming the first sealant 136. For example, an upper connection member of the first package substrate 110 and a lower connection member of the second package substrate 120 may be formed, and then, the gap filler 150 may be formed to cover a corresponding connection member in one of the first package substrate 110 and the second package substrate 120. Here, the upper connection member may include the first pillar 141, and the lower connection member may include the second pillar 143 and the solder 145. However, according to an embodiment, instead of the lower connection member, the upper connection member may include a solder, or each of the lower connection member and the upper connection member may include a solder.

The gap filler 150 may perform the following function as well as a function of filling a region between the first package substrate 110 and the second package substrate 120 to support the first package substrate 110 and the second package substrate 120. First, in a case where the second package substrate 120 is stacked on the first package substrate 110 through a temperature compression bonding (TCB) process, the gap filler 150 may prevent a short circuit between the first connection members 140. Here, the TCB process may denote that the second package substrate 120 is stacked on the first package substrate 110 by applying certain pressure thereto at a high temperature (for example, about 200° C. to about 300° C.). Through the TCB process, the upper connection member of the first package substrate 110 may be coupled to the lower connection member of the second package substrate 120, and thus, the first connection member 140 may be formed. In the TCB process, a solder may flow with fluidity on the basis of melting (i.e., the molten solder may be flowable), and thus, may contact an adjacent solder, causing defects such as a short circuit, deformation, and non-wetting. Here, non-wetting may denote that a solder is separated from a pillar, and an open defect may occur due to non-wetting. However, in the semiconductor package 100 according to the present embodiment, the gap filler 150 may be previously disposed on the upper connection member or the lower connection member, and thus, the flow of the solder 145 may be minimized in the TCB process, thereby preventing defects such as a short circuit, solder deformation, and non-wetting. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Subsequently, in a process of injecting the first sealant 136 to seal the first semiconductor chip 130, the gap filler 150 may prevent a short circuit, solder deformation, and non-wetting from occurring in the first connection members 140 due to the penetration of the first sealant 136 (i.e., flow of the first sealant 136) into a region between the first connection members 140. In a process of injecting the first sealant 136, the first sealant 136 may maintain a high temperature (e.g., a temperature above the melting temperature of the first sealant 136) so that the first sealant 136 is injected with fluidity. In a case where the first sealant 136 having a high temperature penetrates or flows into spaces between the first connection members 140, flow based on melting of a solder may occur, and due to this, a defect such as a short circuit, solder deformation, or non-wetting may occur in the first connection members 140. However, in the semiconductor package 100 according to the present embodiment, the gap filler 150 may previously fill a region between the first connection members 140, and thus, the first sealant 136 may not penetrate the spaces between the first connection members 140, thereby avoiding the problems described above. The first trench T1 of the first package substrate 110 and the second trench T2 of the second package substrate 120 may perform a function like a dam which blocks flow of the first sealant 136, and thus, may more effectively prevent the first sealant 136 from penetrating or flowing into spaces between the first connection members 140, along with the gap filler 150.

For reference, as described above, the gap filler 150 may not be disposed at the opposite end portions of the first package substrate 110 in the second direction. However, as illustrated in FIG. 2C or 3B, the first connection members 140 of one row may be disposed at the opposite end portions of the first package substrate 110 in the first direction, and thus, defects of the first connection members 140 caused by the injection of the first sealant 136 may be minimized. For example, defects of the first connection members 140 caused by the injection of the first sealant 136 may occur in a direction (e.g., in the second direction) in which the first sealant 136 flows. However, the first connection members 140 of one row may be disposed at the opposite end portions of the first package substrate 110 in the first direction, and as seen through the arrow of the injection path IP of FIG. 3A, the first sealant 136 may be injected to be vertical to a direction (e.g., in the first direction) in which the first connection members 140 are arranged, thereby minimizing defects of the first connection members 140 caused by the penetration of the first sealant 136.

The upper package 160 may be mounted on the second package substrate 120 by using the second connection member 162. The upper package 160 may include an upper substrate 161, a chip stack portion 163, a third connection member 165, and a second sealant 169.

The upper substrate 161 may include a wiring substrate, and thus, may have a structure similar to that of the first package substrate 110. The upper substrate 161 may be formed to have a size and a thickness, which are less than those of the first package substrate 110. According to an embodiment, the upper substrate 161 may be formed based on an active wafer such as a silicon wafer.

The chip stack portion 163 may be stacked on the upper substrate 161 by using the third connection member 165 and may include at least one second semiconductor chip. In the semiconductor package 100 according to the present embodiment, the chip stack portion 163 may include four second semiconductor chips 163c. However, the number of second semiconductor chips of the chip stack portion 163 is not limited thereto. For example, the chip stack portion 163 may include one to three or five or more second semiconductor chips. The second semiconductor chip 163c may include a volatile memory semiconductor chip, such as dynamic random access memory (DRAM) or static random access memory (SRAM), or a non-volatile memory chip such as flash memory, phase-change random access memory (PRAM), magnetoresistive random access memory (MRAM), ferroelectric random access memory (FeRAM), or resistive random access memory (RRAM). In the semiconductor package 100 according to the present embodiment, the second semiconductor chip 163c may include a DRAM chip.

The second semiconductor chip 163c may be stacked on a second semiconductor chip 163c of a corresponding lower portion through an adhesive layer 163p. A second semiconductor chip 163c of a lowermost portion may be stacked on the upper substrate 161 through the third connection member 165 and the underfill 167. According to an embodiment, instead of the underfill 167, the adhesive layer 163p may be disposed between the upper substrate 161 and the lowermost second semiconductor chip 163c. Although not shown, the second semiconductor chip 163c may include a through silicon via (TSV), except for the uppermost second semiconductor chip 163c. Therefore, the second semiconductor chip 163c may be electrically connected to the upper substrate 161 or a second semiconductor chip 163c of a corresponding lower portion through the TSV, a bump, and the third connection member 165. The adhesive layer 163p may surround a bump between adjacent second semiconductor chips 163c.

According to an embodiment, the upper package 160 may have a structure where at least one second semiconductor chip 163c is mounted on the upper substrate 161 through a wire bonding structure. In a case where the upper package 160 has such a structure, the third connection member 165 may not be disposed between the upper substrate 161 and the second semiconductor chip 163c of the lowermost portion. The second semiconductor chip 163c may not include a TSV. The second semiconductor chip 163c may be electrically connected to the upper substrate 161 through a bonding wire, and the adhesive layer 163p may attach the second semiconductor chip 163c to the upper substrate 161 and may attach each second semiconductor chip 163c to a corresponding second semiconductor chip 163c. Furthermore, in the wire bonding structure, a plurality of second semiconductor chips 163c may be stacked in a staircase structure or a zigzag structure.

The second sealant 169 may cover a side surface and a top surface of the chip stack portion 163 on the upper substrate 161. The second sealant 169 may cover a side surface of the underfill 167. According to an embodiment, the second sealant 169 may not cover a top surface of the chip stack portion 163, for example, a top surface of the uppermost second semiconductor chip 163c of the chip stack portion 163. Therefore, the top surface of the uppermost second semiconductor chip 163c may be externally exposed from the second sealant 169. The second sealant 169 may include or may be formed of, for example, an EMC. However, a material of the second sealant 169 is not limited to the EMC.

In the semiconductor package 100 according to the present embodiment, the first semiconductor chip 130 may be disposed between the first and second trenches T1 and T2 formed in the first and second package substrates 110 and 120, and the gap filler 150 including or being formed of a material which differs from that of the first sealant 136 may surround the first connection member 140 between the first and second package substrates 110 and 120 to implement a fine pitch of the first connection members 140 and to decrease a total height of a package. In the semiconductor package 100 according to the present embodiment, a defect such as a short circuit, solder deformation, or non-wetting in the first connection member 140 may be prevented by the gap filler 150. Accordingly, a semiconductor package having a PoP structure with enhanced reliability may be implemented.

To provide a more detailed description on a fine pitch of the first connection member 140 in the semiconductor package 100 according to the present embodiment, a pitch of connection members connecting package substrates may be adjusted based on a size of a gap between the package substrates and a structure of the connection member. For example, when a gap between package substrates is relatively large and a connection member includes only a solder, a pitch of the connection members may be based on an aspect ratio and a size of the solder. For example, in order to prevent a short circuit defect between connection members and prevent an open defect caused by non-wetting, an aspect ratio and a size of a solder have to be ensured, and thus, there is a limitation in decreasing a pitch of connection members.

On the other hand, in the semiconductor package 100 according to the present embodiment, the first and second trenches T1 and T2 may be formed in the first and second package substrates 110 and 120 and the first semiconductor chip 130 may be disposed between the first and second trenches T1 and T2, and thus, a gap (e.g., the shortest distance) between the first and second package substrates 110 and 120 may decrease by a sum of depths of the first and second trenches T1 and T2 at a region where the first semiconductor chip 130 is disposed. For example, when a gap between conventional package substrates including no trench is about 100 μm to about 200 μm and a depth of each of the first and second trenches T1 and T2 of the first and second package substrates 110 and 120 is about 10 μm to about 15 μm, a gap (the shortest distance) between the first and second package substrates 110 and 120 may be 70 μm to 180 μm, which corresponds to a size obtained by decreasing 100 μm to 200 μm by 20 μm to 30 μm. The gap between the first and second package substrates 110 and 120 may correspond to a distance between a top surface of the upper passivation layer 113u of the first package substrate 110 and a bottom surface of the lower passivation layer 123d of the second package substrate 120.

In the semiconductor package 100 according to the present embodiment, the first connection member 140 may have a structure including the first and second pillars 141 and 143 and the solder 145, and the gap filler 150 may be filled in spaces between the first connection members 140. Therefore, comparing a structure of a conventional connection member including only a solder, defective problems of a short circuit and non-wetting may be considerably reduced. Here, as described above, a short circuit and non-wetting may occur in a process of stacking the second package substrate 120 and a process of injecting the first sealant 136. As a result, in the semiconductor package 100 according to the present embodiment, the first connection members 140 may be disposed to have the fine pitch described above on the basis of the reduction in a gap between the first and second package substrates 110 and 120, a structure of the first connection member 140, and the presence of the gap filler 150.

A total height of the semiconductor package 100 may decrease by a depth of a sum of the first and second trenches T1 and T2. For example, when the depth of each of the first and second trenches T1 and T2 is about 10 μm to about 15 μm, the total height of the semiconductor package 100 may decrease by about 20 μm to about 30 μm, which is a sum of the first and second trenches T1 and T2.

Figure 4A:
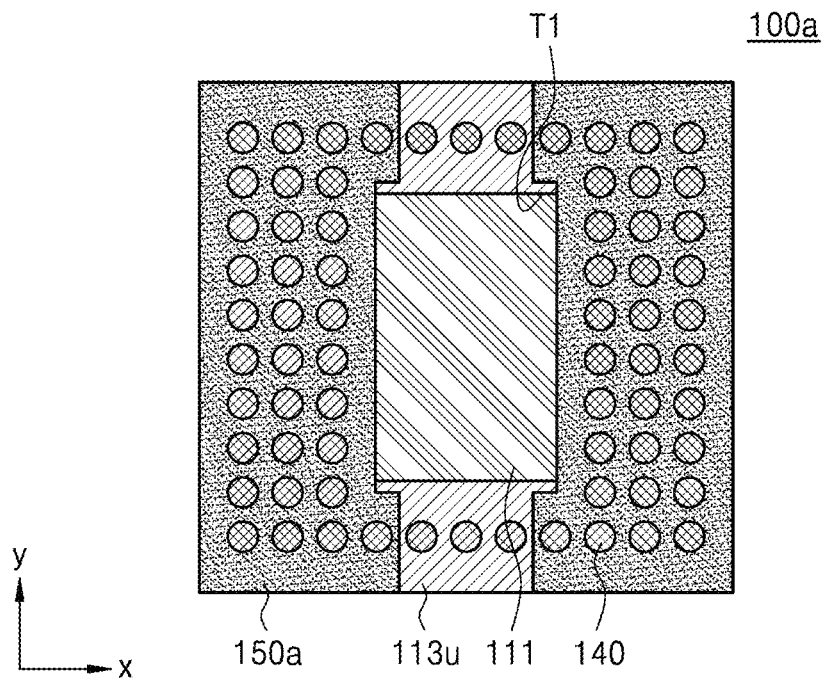
FIGS. 4A to 4C are plan views illustrating various embodiments of a structure of a gap filler, based on the semiconductor package of FIG. 1.
Figure 4B:
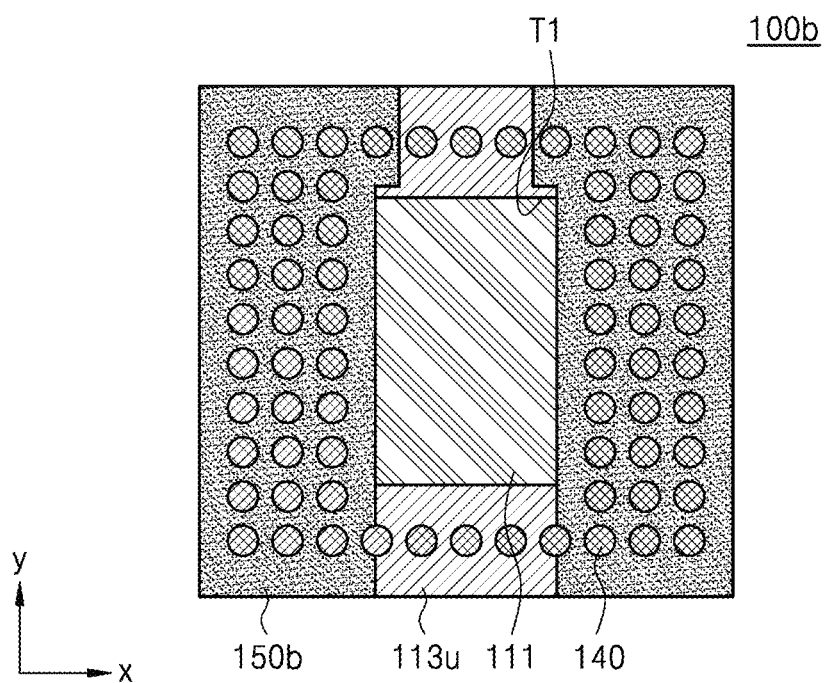
Figure 4C:
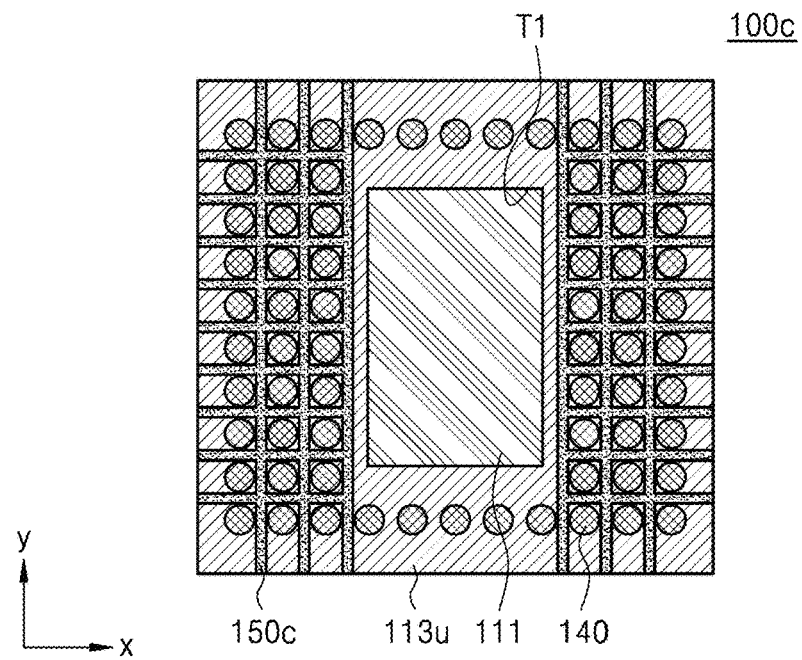

FIGS. 4A to 4C are plan views illustrating various embodiments of a structure of a gap filler, based on the semiconductor package of FIG. 1 Descriptions, which are the same as or similar to descriptions given above with reference to FIGS. 1 to 3B, are briefly given below or omitted.

Referring to FIG. 4A, in a structure of a gap filler 150a, a semiconductor package 100a according to the present embodiment may differ from the semiconductor package 100 of FIG. 1. For example, in the semiconductor package 100a according to the present embodiment, a width in a first direction (e.g., an x direction) of opposite end portions of the gap filler 150a in a second direction (e.g., a y direction) may be greater than a width in the first direction of the central portions of the gap filler 150a in the second direction. For example, the gap filler 150a may have a '['-shape or a recessed portion at the central portions in the second direction. A gap between the gap fillers 150a in the first direction (e.g., the x direction) at a portion corresponding to an injection path IP (e.g., at the opposite end portions of the gap filler 150a) may be narrower than a gap between the gap fillers 150a in the first direction at the central portions or a width of a first trench T1 in the first direction (the x direction). A width, in the first direction (e.g., the x direction), of the gap filler 150a at the opposite end portions thereof in the second direction (e.g., the y direction) may be greater than a width, in the first direction, of the gap filler 150a at the central portions thereof in the second direction, and thus, the gap filler 150a at the opposite end portions thereof may surround and protect more first connection members 140, thereby decreasing defects such as a short circuit, solder deformation, and non-wetting of the first connection members 140.

Referring to FIG. 4B, in a structure of a gap filler 150b, a semiconductor package 100b according to the present embodiment may differ from the semiconductor package 100 of FIG. 1. For example, in the semiconductor package 100b according to the present embodiment, a width in a first direction (an x direction) in one end portion of the gap filler 150b in a second direction (a y direction) may be greater than a width of another portion thereof. For example, the gap filler 150b may have a 'L'-shape. Based on such a structure of the gap filler 150b, in a portion corresponding to an injection path IP, a gap between the gap fillers 150b in the first direction (e.g., the x direction) may be narrower than a width of a first trench T1 in the first direction (e.g., the x direction). A width of the gap filler 150b at the one end portion thereof (for example, the end portion corresponding to the injection path IP) in the second direction (the y direction) may be greater than a width of the gap filler 150b at the other portions in the second direction, and thus, the gap filler 150b may surround and protect more first connection members 140, thereby decreasing defects such as a short circuit, solder deformation, and non-wetting of the first connection members 140.

Referring to FIG. 4C, in a structure of a gap filler 150c, a semiconductor package 100c according to the present embodiment may differ from the semiconductor package 100 of FIG. 1. For example, in the semiconductor package 100c according to the present embodiment, the gap filler 150c may be disposed on an upper passivation layer 113u of a first package substrate 110 at opposite sides of a first semiconductor chip 130 or a first trench T1 in a first direction (e.g., an x direction), and may be disposed in a lattice shape between a plurality of first connection members 140. For example, it may be seen that the first connection members 140 are disposed between adjacent portions of the gap filler 150c having a lattice shape. As illustrated, the gap filler 150c may not be disposed at a portion corresponding to an injection path IP.

The gap filler 150c having a lattice shape may include or may be formed of NCP. For example, the gap filler 150c may be formed by dispensing NCP into spaces between the first connection members 140 in a lattice shape by using a dispenser. In a process of stacking the second package substrate 120 and a process of injecting a first sealant 136, the gap filler 150c having a lattice shape may surround and protect the first connection members 140, thereby preventing defects such as a short circuit, solder deformation, and non-wetting of the first connection members 140.

Figure 5:
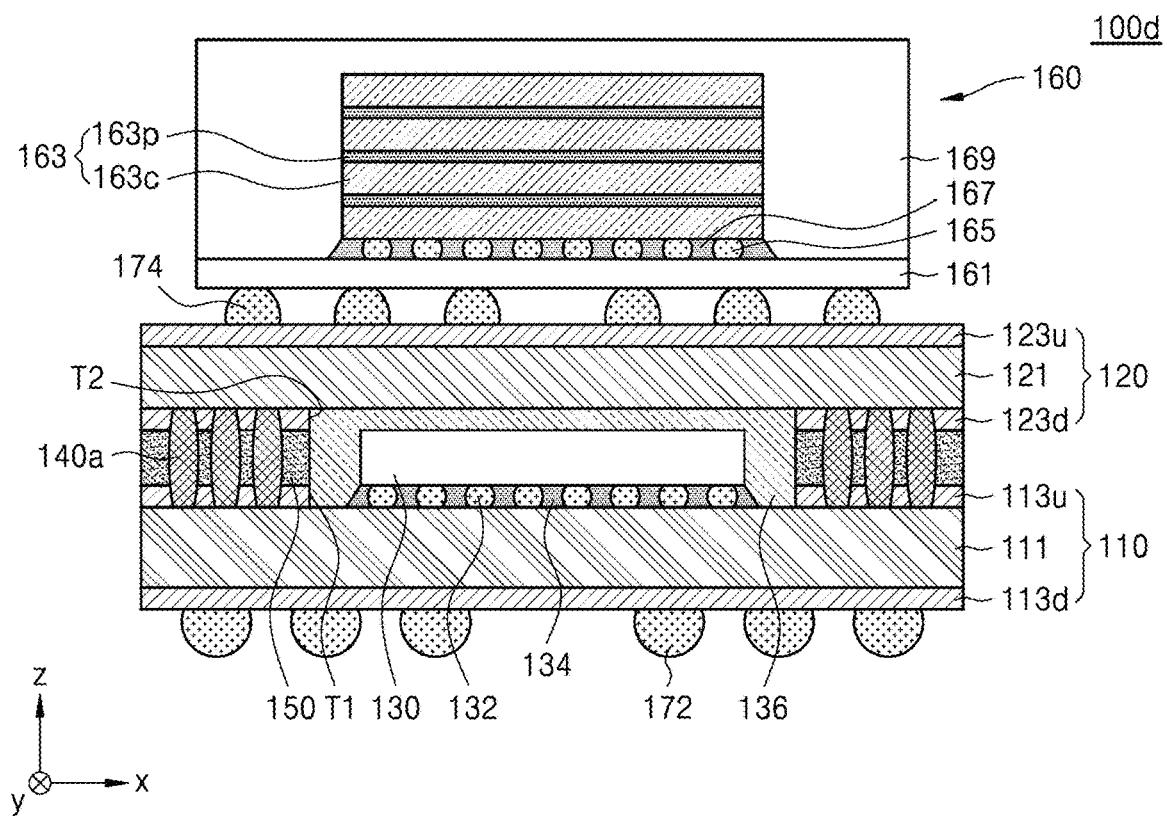
FIG. 5 is a cross-sectional view of a semiconductor package having a PoP structure according to an embodiment.

FIG. 5 is a cross-sectional view of a semiconductor package 100d having a PoP structure according to an embodiment. Descriptions, which are the same as or similar to descriptions given above with reference to FIGS. 1 to 3B, are briefly given below or omitted.

Referring to FIG. 5, in a structure of a first connection member 140a, the semiconductor package 100d according to the present embodiment may differ from the semiconductor package 100 of FIG. 1. For example, in the semiconductor package 100d according to the present embodiment, the first connection member 140a may include only a solder. In the semiconductor package 100d according to the present embodiment, a gap filler 150 may fill in spaces between two adjacent first connection members of a plurality of first connection members 140a, and thus, although the first connection member 140a includes only a solder, defects such as a short circuit, solder deformation, and non-wetting of the first connection members 140a may be prevented in a process of stacking a second package substrate 120 and a process of injecting a first sealant 136.

In FIG. 5, the first connection member 140a may have a solder single-layer structure including or being formed of one solder, but according to embodiments, the first connection member 140a may include or may be formed of a solder multi-layer structure where a plurality of solders are stacked. As shown in FIG. 3A, the gap filler 150 may have a rectangular shape which is long in a second direction (e.g., a y direction). However, the gap filler 150 is not limited thereto and may have a shape of one of the gap fillers 150a to 150c of FIGS. 4A to 4C.

Figure 6A:
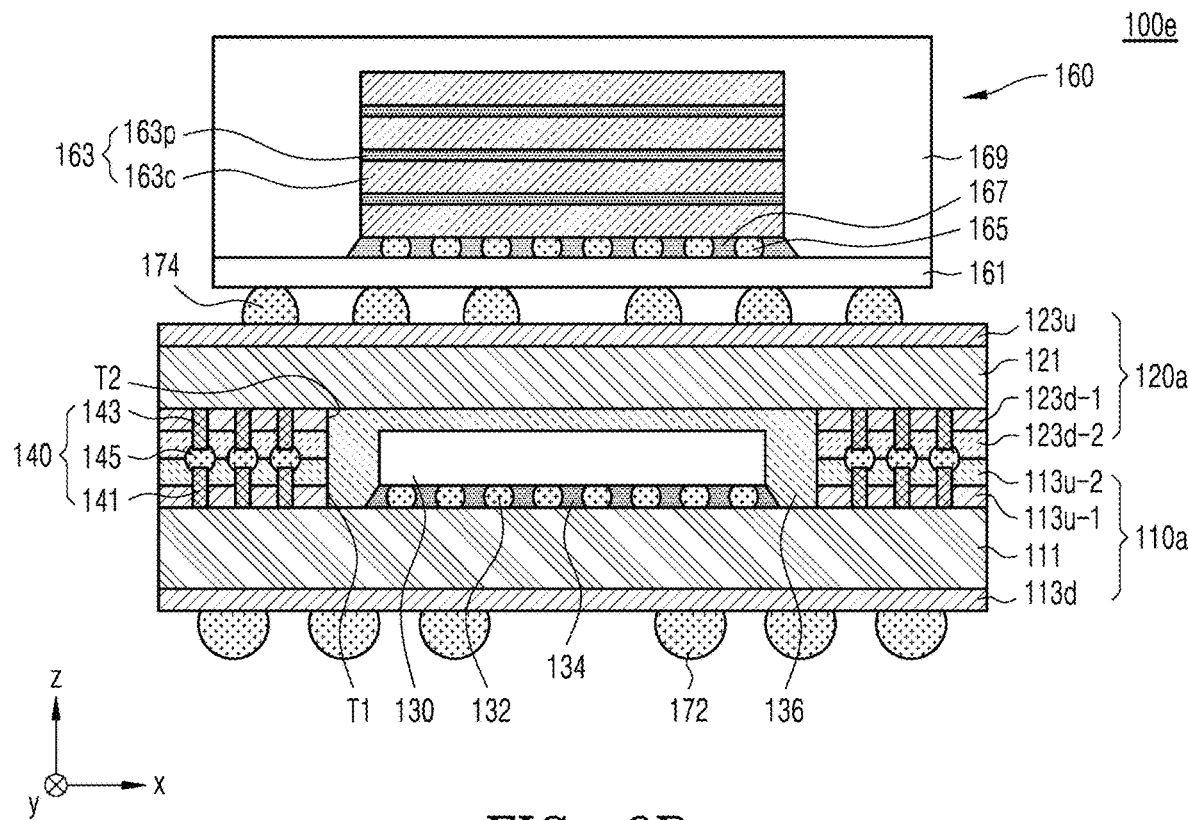
FIGS. 6A to 8B are cross-sectional views, perspective views, and plan views illustrating semiconductor packages having a PoP structure according to embodiments.
Figure 6B:
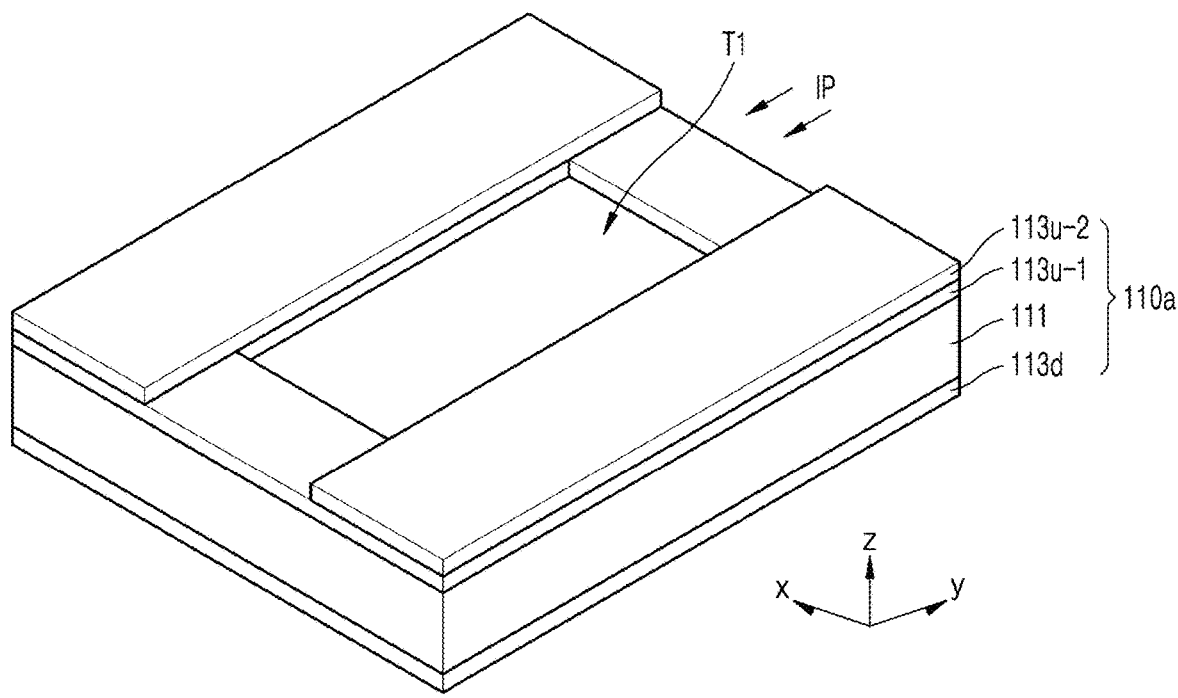
Figure 6C:
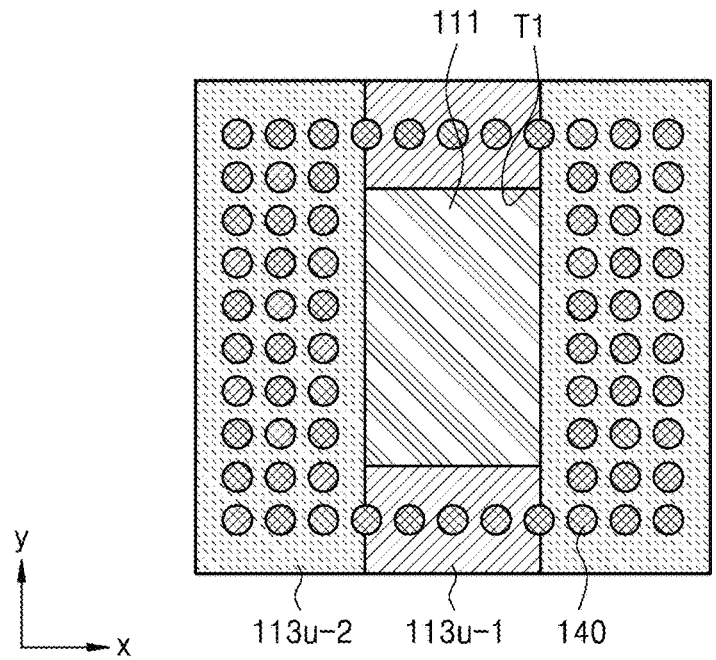
Figure 7A:
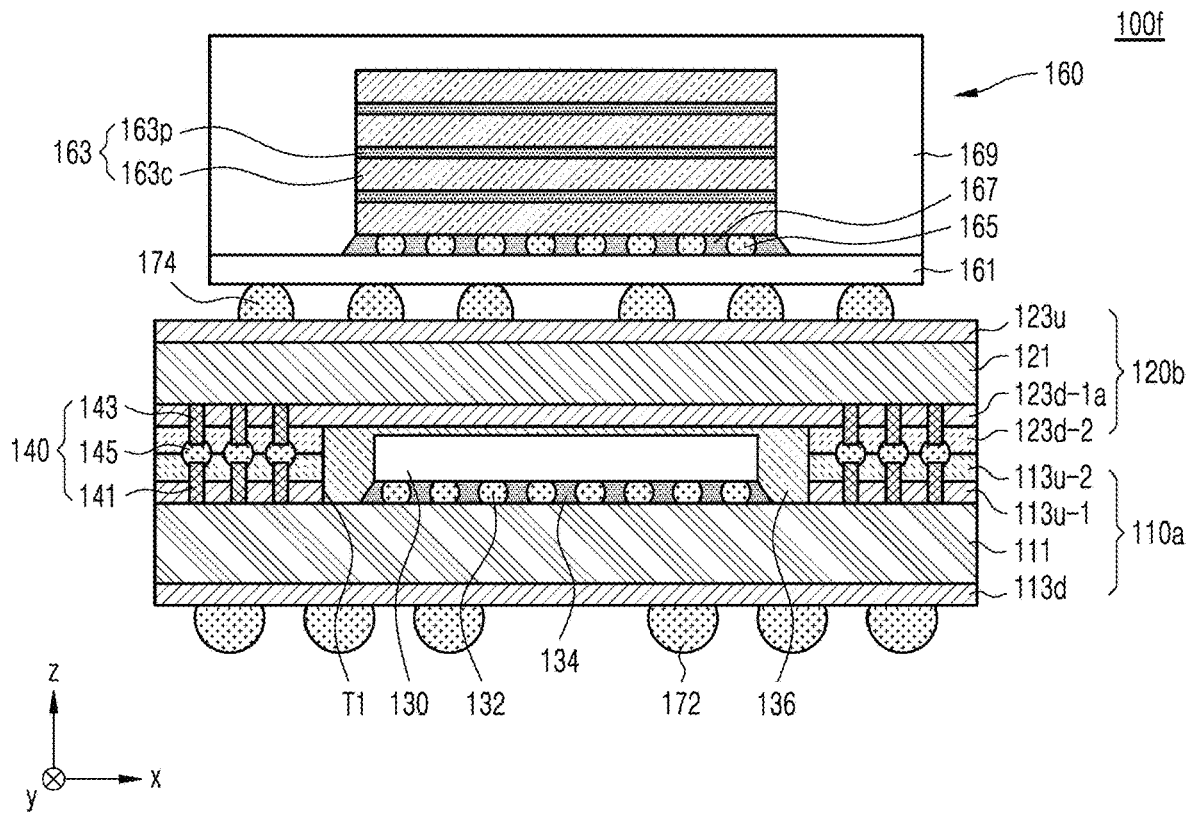
Figure 7B:
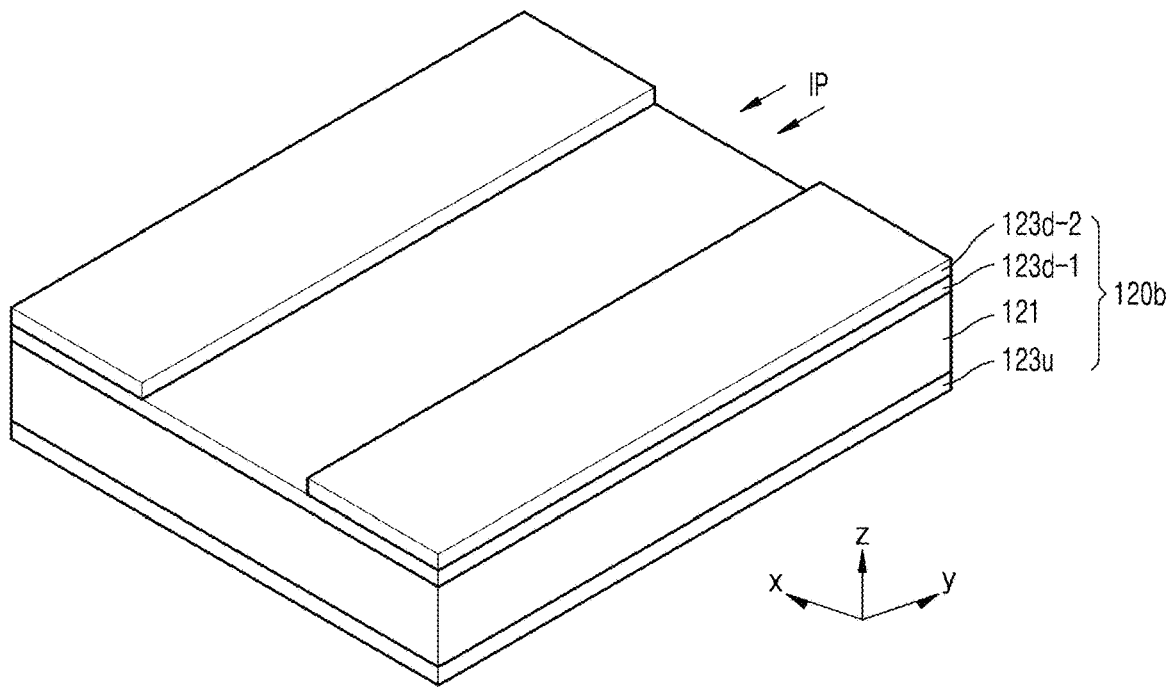
Figure 8A:
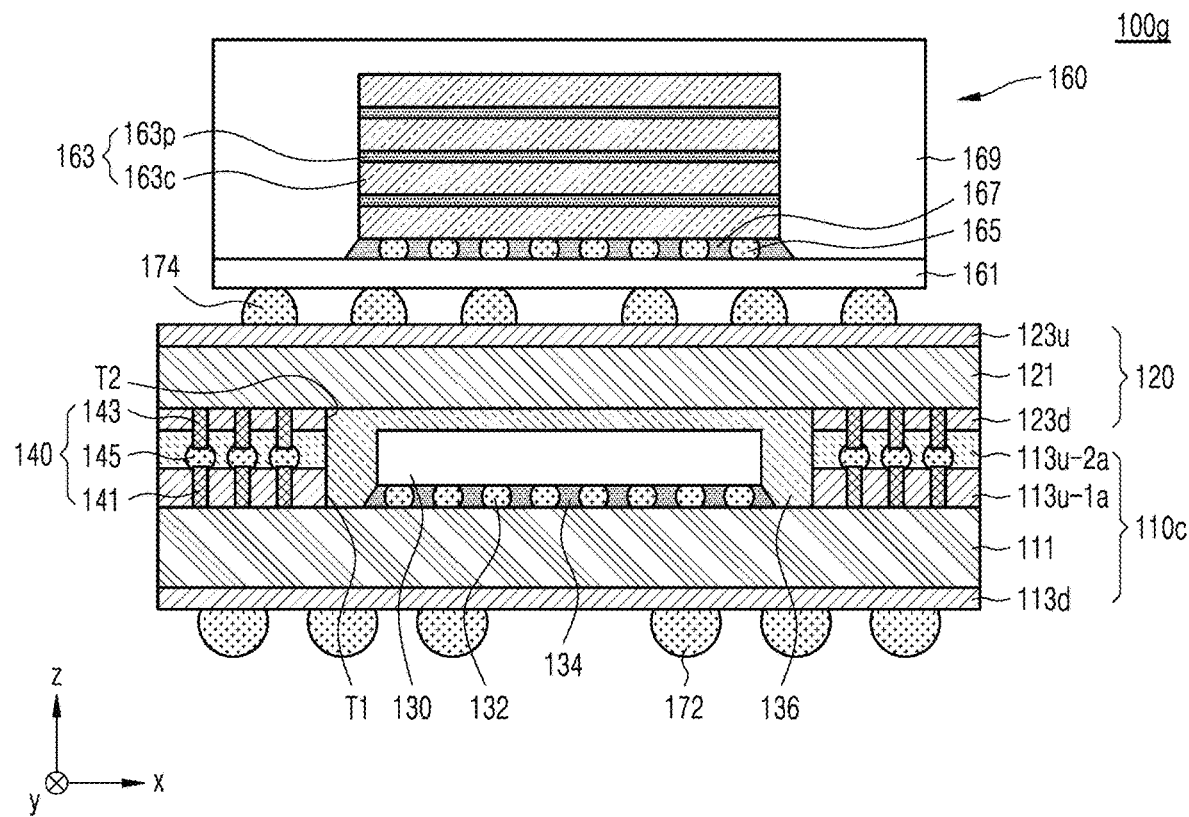
Figure 8B:
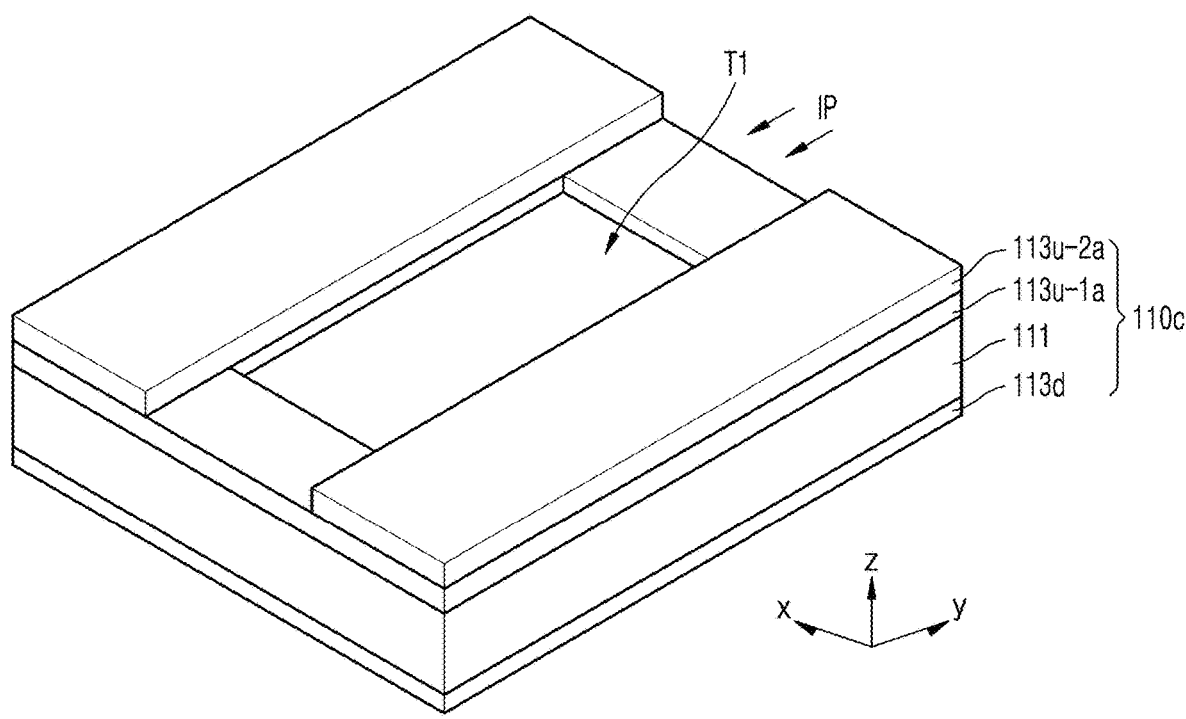

FIGS. 6A to 8B are cross-sectional views, perspective views, and plan views illustrating semiconductor packages having a PoP structure according to embodiments. FIGS. 6B, 7B, and 8B are perspective views illustrating a structure of a gap filler in semiconductor packages of FIGS. 6A, 7A, and 8A, and FIG. 6C is a plan view illustrating a structure of a gap filler in the semiconductor package of FIG. 6A. Descriptions, which are the same as or similar to descriptions given above with reference to FIGS. 1 to 3B, are briefly given below or omitted.

Referring to FIGS. 6A to 6C, in a structure of each of an upper passivation layer of a first package substrate 110a and a lower passivation layer of a second package substrate 120a, a semiconductor package 100e according to the present embodiment may differ from the semiconductor package 100 of FIG. 1. For example, in the semiconductor package 100e according to the present embodiment, the first package substrate 110a may include a first upper passivation layer 113u-1 and a second upper passivation layer 113u-2 on a top surface of a first body layer 111, and the second package substrate 120a may include a first lower passivation layer 123d-1 and a second lower passivation layer 123d-2 on a bottom surface of a second body layer 121. The first upper passivation layer 113u-1, the second upper passivation layer 113u-2, the first lower passivation layer 123d-1, and the second lower passivation layer 123d-2 may each include or may be formed of SR. However, a material of each of the first and second upper passivation layers 113u-1 and 113u-2 and the first and second lower passivation layers 123d-1 and 123d-2 is not limited to SR.

A first trench T1 of the first package substrate 110a may be formed by removing a center portion of each of the first upper passivation layer 113u-1 and the second upper passivation layer 113u-2. In some embodiments, the first body layer 111 may be exposed via the first trench T1 of the first package substrate 110a. A second trench T2 of the second package substrate 120a may be formed by removing a center portion of each of the first lower passivation layer 123d-1 and the second lower passivation layer 123d-2. In some embodiments, the second body layer 121 may be exposed via the second trench T2 of the second package substrate 120a. The first trench T1 and the second trench T2 may each have an area which enables the first semiconductor chip 130 to be accommodated thereinto. For example, the area of each of the first and second trenches T1 and T2 may be greater than that of the first semiconductor chip 130.

In the semiconductor package 100e according to the present embodiment, the second upper passivation layer 113u-2 and the second lower passivation layer 123d-2 may perform a function of a gap filler. For example, the second upper passivation layer 113u-2 and the second lower passivation layer 123d-2 may be referred to as a gap filler. As illustrated in FIG. 6B, the second upper passivation layer 113u-2 may have a rectangular shape which is long in a second direction (e.g., a y direction), on the first upper passivation layer 113u-1. Widths of the second upper passivation layer 113u-2 and the first upper passivation layer 113u-1 in a first direction (an x direction) may be substantially the same, at opposite sides of the first trench T1 in the first direction (e.g., the x direction). However, according to an embodiment, a width of the second upper passivation layer 113u-2 in the first direction (the x direction) may be less than that of the first upper passivation layer 113u-1 in the first direction (the x direction). Although not shown, the second lower passivation layer 123d-2 may have substantially the same structure as that of the second upper passivation layer 113u-2. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

According to embodiments, an upper passivation layer of the first package substrate 110a and a lower passivation layer of the second package substrate 120a may each have a multi-layer structure of three or more layers. In a case where the upper passivation layer of the first package substrate 110a and the lower passivation layer of the second package substrate 120a each have a multi-layer structure of three or more layers, the first trench T1 and the second trench T2 may be formed by removing all of such multilayer, or may be formed by removing a portion of the multilayer. Some of upper layers of a multilayer may perform a function of a gap filler.

Furthermore, without a gap filler, the upper passivation layer of the first package substrate 110a and the lower passivation layer of the second package substrate 120a each have a single-layer structure. In such a structure, the upper passivation layer and the lower passivation layer may be formed to have a thickness, which is sufficient to cover a thickness of a gap filler, and an upper portion of at least one of the upper passivation layer and the lower passivation layer may perform a function of a gap filler.

Referring to FIGS. 7A and 7B, in a semiconductor package 100f according to the present embodiment, a second trench may not separately be formed, and thus, the semiconductor package 100f according to the present embodiment may differ from the semiconductor package 100e of FIG. 6A. For example, in the semiconductor package 100f according to the present embodiment, the first package substrate 110a may include a first upper passivation layer 113u-1 and a second upper passivation layer 113u-2 on a top surface of a first body layer 111, and the second package substrate 120a may include a first lower passivation layer 123d-1a and a second lower passivation layer 123d-2 on a bottom surface of a second body layer 121.

The first trench T1 of the first package substrate 110a, like the first package substrate 110a of FIG. 6A, may be formed by removing a center portion of each of the first upper passivation layer 113u-1 and the second upper passivation layer 113u-2. The first trench T1 may have an area which enables the first semiconductor chip 130 to be accommodated thereinto. However, as illustrated in FIG. 7B, a separate trench may not be formed in the second package substrate 120b. Therefore, the first lower passivation layer 123d-1a may be formed on a whole bottom surface of the second body layer 121 of the second package substrate 120b. In the semiconductor package 100f according to the present embodiment, the second upper passivation layer 113u-2 of the first package substrate 110a and the second lower passivation layer 123d-2 of the second package substrate 120b may perform a function of a gap filler and may have a rectangular shape, which is long in the second direction (e.g., the y direction). For example, the second lower passivation layer 123d-2 may be disposed in a rectangular shape, which is long in the second direction (the y direction), on opposite outer portions of the first lower passivation layer 123d-1a in a first direction (e.g., an x direction).

Referring to FIGS. 8A and 8B, in a structure of each of an upper passivation layer of a first package substrate 110a, a semiconductor package 100g according to the present embodiment may differ from the semiconductor package 100 of FIG. 1. For example, in the semiconductor package 100g according to the present embodiment, the second package substrate 120 may be substantially the same as the second package substrate 120 of the semiconductor package 100 of FIG. 1. Therefore, the second package substrate 120 may include a lower passivation layer 123d on a bottom surface of a second body layer 121.

In the semiconductor package 100g according to the present embodiment, like the semiconductor package 100e of FIG. 6A, the first package substrate 110c may include a first upper passivation layer 113u-1a and a second upper passivation layer 113u-2a on a top surface of the first body layer 111. However, a thickness of each of the first upper passivation layer 113u-1a and the second upper passivation layer 113u-2a may be thicker than that of each of the first upper passivation layer 113u-1 and the second upper passivation layer 113u-2 of the first package substrate 110a of the semiconductor package 100e of FIG. 6A. For example, a sum of the thicknesses of the first upper passivation layer 113u-1a and the second upper passivation layer 113u-2a may be substantially the same as a sum of thicknesses of the gap filler 150 and the upper passivation layer 113u of the semiconductor package 100 of FIG. 1.

A first trench T1 of the first package substrate 110c may be formed by removing a center portion of each of the first upper passivation layer 113u-1a and the second upper passivation layer 113u-2a. A second trench T2 of the second package substrate 120a may be formed by removing a center portion of the lower passivation layer 123d. The first trench T1 and the second trench T2 may each have an area which enables the first semiconductor chip 130 to be accommodated thereinto.

In the semiconductor package 100g according to the present embodiment, the second upper passivation layer 113u-2a may perform a function of a gap filler. For example, the second upper passivation layer 113u-2a may be referred to as a gap filler. Therefore, as illustrated in FIG. 8B, the second upper passivation layer 113u-2a may have a rectangular structure which is long in a second direction (e.g., a y direction), on the first upper passivation layer 113u-1a. According to embodiments, the first upper passivation layer 113u-1a of the first package substrate 110c may have substantially the same thickness as that of the upper passivation layer 113u of the first package substrate 110 of the semiconductor package 100 of FIG. 1, and the second upper passivation layer 113u-2a may have substantially the same thickness as that of the gap filler 150 of the semiconductor package 100 of FIG. 1.

Figure 9A:
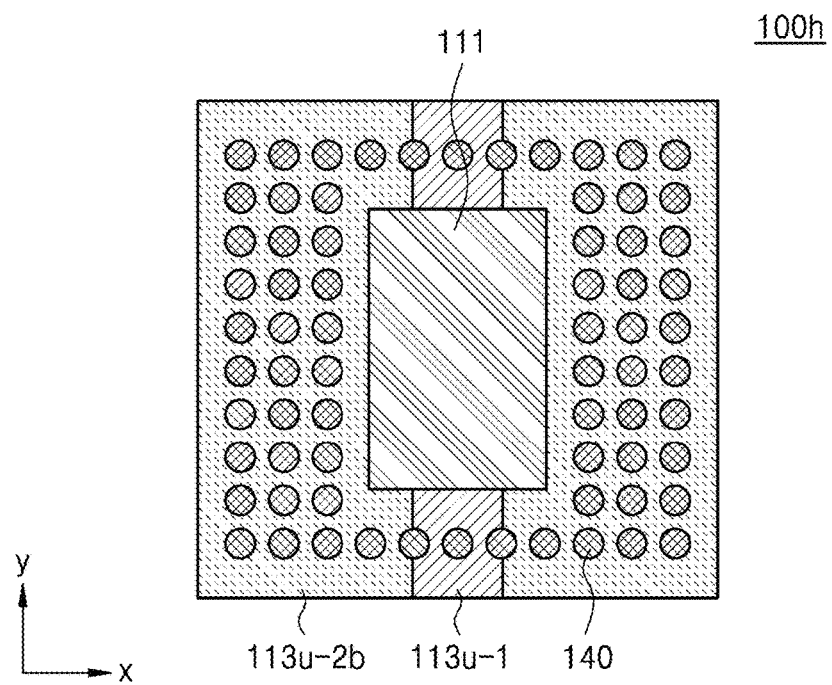
FIGS. 9A to 9C are plan views illustrating various embodiments of a structure of a gap filler, in one of the semiconductor packages of FIGS. 6A, 7A, and 8A.
Figure 9B:
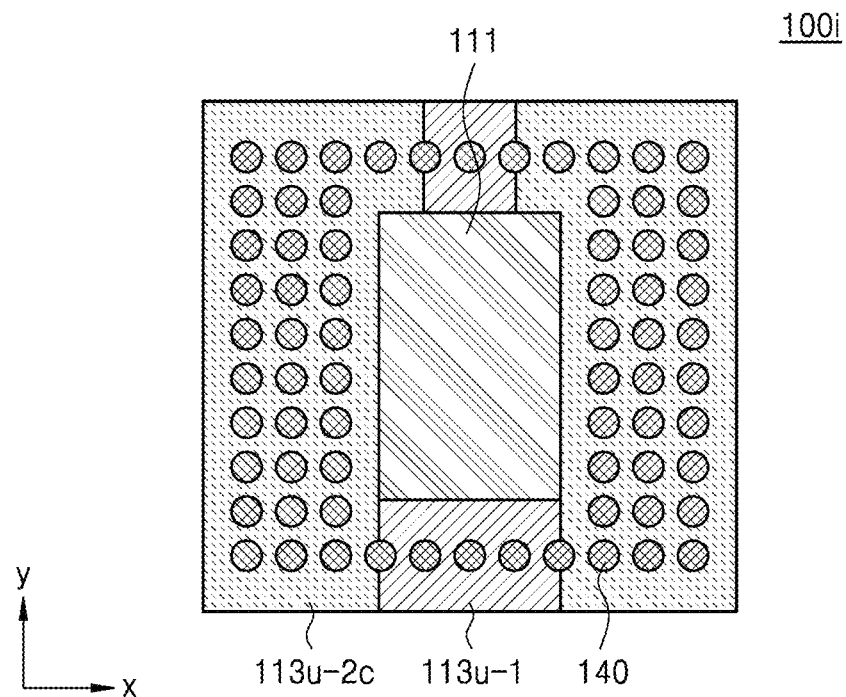
Figure 9C:
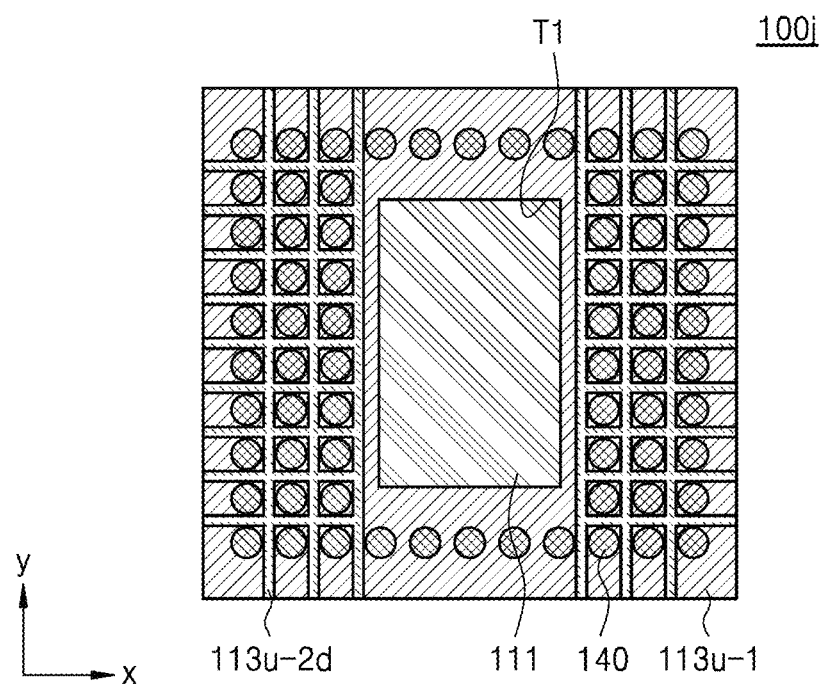

FIGS. 9A to 9C are plan views illustrating various embodiments of a structure of a gap filler, in one of the semiconductor packages of FIGS. 6A, 7A, and 8A. Descriptions, which are the same as or similar to descriptions given above with reference to FIGS. 6A to 8B, are briefly given below or omitted.

Referring to FIG. 9A, in a structure of a second upper passivation layer 113u-2b or a second lower passivation layer, a semiconductor package 100h according to the present embodiment may differ from the semiconductor package 100e of FIG. 6A. For example, in the semiconductor package 100h according to the present embodiment, a width in a first direction (e.g., an x direction) of opposite end portions of the second upper passivation layer 113u-2b in a second direction (e.g., a y direction) may be greater than a width of another portion thereof. For example, the second upper passivation layer 113u-2b may have a '['-shape. Based on such a structure of the second upper passivation layer 113u-2b, in a portion corresponding to an injection path IP, a gap between second upper passivation layers 113u-2b in the first direction (e.g., the x direction) may be narrower than a width of a first trench T1 in the first direction (e.g., the x direction). A width of the second upper passivation layer 113u-2b at the opposite end portions thereof in the second direction (e.g., the y direction) may be greater than a width of the second upper passivation layer 113u-2b at the central portions in the second direction, and thus, the second upper passivation layer 113u-2b may surround and protect more first connection members 140, thereby decreasing defects such as a short circuit, solder deformation, and non-wetting of the first connection members 140.

Referring to FIG. 9B, in a structure of a second upper passivation layer 113u-2c or a second lower passivation layer, a semiconductor package 100i according to the present embodiment may differ from the semiconductor package 100e of FIG. 6A. For example, in the semiconductor package 100i according to the present embodiment, a width in a first direction (e.g., an x direction) at one end portion of the second upper passivation layer 113u-2c in a second direction (e.g., a y direction) may be greater than a width of another portion thereof in the second direction. For example, the second upper passivation layer 113u-2c may have a 'L'-shape. Based on such a structure of the second upper passivation layer 113u-2c, in a portion corresponding to an injection path IP, a gap between second upper passivation layers 113u-2c in the first direction (e.g., the x direction) at the one end portion of the second upper passivation layer 113u-2c may be narrower than a width of a first trench T1 in the first direction (e.g., the x direction) at another portion. A width of the second upper passivation layer 113u-2c at the one end portion thereof (for example, an end portion corresponding to the injection path IP) in the second direction (the y direction) may be greater than a width of the second upper passivation layer 113u-2c at another portion, and thus, the second upper passivation layer 113u-2c may surround and protect more first connection members 140, thereby decreasing defects such as a short circuit, solder deformation, and non-wetting of the first connection members 140.

Referring to FIG. 9C, in a structure of a second upper passivation layer 113u-2d or a second lower passivation layer, a semiconductor package 100j according to the present embodiment may differ from the semiconductor package 100e of FIG. 6A. For example, in the semiconductor package 100j according to the present embodiment, the second upper passivation layer 113u-2d may be disposed on a first upper passivation layer 113u-1 of a first package substrate 110 at opposite sides of a first semiconductor chip 130 or a first trench T1 in a first direction (an x direction), and may be disposed in a lattice shape between a plurality of first connection members 140. For example, it may be seen that the first connection members 140 are disposed between adjacent portions of the second upper passivation layer 113u-2d having a lattice shape. As illustrated, the second upper passivation layer 113u-2d may not be disposed at a portion corresponding to an injection path IP. In a process of stacking the second package substrate 120 and a process of injecting a first sealant 136, the second upper passivation layer 113u-2d having a lattice shape may surround and protect the first connection members 140, thereby preventing defects such as a short circuit, solder deformation, and non-wetting of the first connection members 140.

Figure 10:
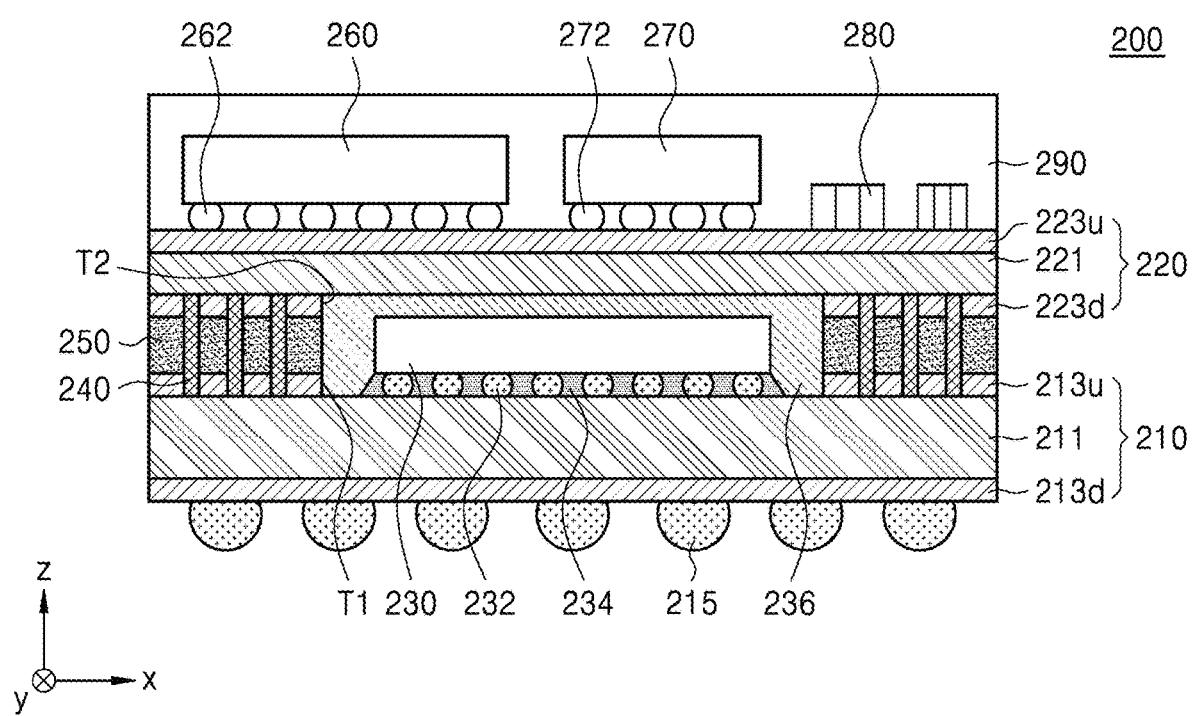
FIG. 10 is a cross-sectional view of a semiconductor package having a PoP structure according to an embodiment.

FIG. 10 is a cross-sectional view of a semiconductor package 200 having a PoP structure according to an embodiment. Descriptions, which are the same as or similar to descriptions given above with reference to FIGS. 1 to 3B, are briefly given below or omitted.

Referring to FIG. 10, the semiconductor package 200 according to the present embodiment may include a first redistribution wiring layer 210 and a second redistribution wiring layer 220, instead of a first package substrate 110 and a second package substrate 120, and may also include two upper packages 260 and 270 and a passive element 280, and thus, may differ from the semiconductor package 100 of FIG. 1. For example, the semiconductor package 200 according to the present embodiment may include the first redistribution wiring layer 210, the second redistribution wiring layer 220, a first semiconductor chip 230, a first connection member 240, a gap filler 250, first and second upper packages 260 and 270, the passive element 280, and a second sealant 290.

The first redistribution wiring layer 210 may be disposed under the first semiconductor chip 230, and chip pads of the first semiconductor chip 230 may be redistributed in an outer region of the first semiconductor chip 230 through the first redistribution wiring layer 210. For example, the first redistribution wiring layer 210 may connect the chip pads of the first semiconductor chip 230 to an outer connection pad on a bottom surface of the first redistribution wiring layer 210 through a redistribution wiring, and thus, may rearrange the chip pads of the first semiconductor chip 230 on an area which is greater than the first semiconductor chip 230. The first redistribution wiring layer 210 may include a first body layer 211 including or being formed of an insulating material such as a photo imageable dielectric (PID) resin, an upper passivation layer 213u on a top surface of the first body layer 211, and a lower passivation layer 213d on a bottom surface of the first body layer 211. A redistribution wiring having a single-layer or multi-layer structure may be disposed in the first body layer 211. The first redistribution wiring layer 210 may include a first trench T1 which is formed by removing a center portion of the upper passivation layer 213u.

An outer connection member 215 may be disposed on a bottom surface of the first redistribution wiring layer 210. As illustrated in FIG. 10, the outer connection member 215 may be disposed on a first portion, corresponding to a bottom surface of the first semiconductor chip 230, and a second portion which is the outside of the first portion in a first direction (e.g., an x direction) and a second direction (e.g., a y direction). A package structure, where the outer connection member 215 is widely disposed outside a bottom surface of the first semiconductor chip 230, may be referred to as a fan-out (FO) package structure. On the other hand, a package structure where an outer connection member is disposed on only a portion corresponding to a bottom surface of a first semiconductor chip, may be referred to as a fan-in (FI) package structure.

The second redistribution wiring layer 220 may be disposed on the first redistribution wiring layer 210 and the first semiconductor chip 230. The second redistribution wiring layer 220 may be electrically connected to the first redistribution wiring layer 210 through the first connection member 240. The second redistribution wiring layer 220 may include a second body layer 221, an upper passivation layer 223u, and a lower passivation layer 223d. The second redistribution wiring layer 220 may include a second trench T2 which is formed by removing a center portion of the lower passivation layer 223d. A material or a structure of the second redistribution wiring layer 220 may be substantially the same as that of the first redistribution wiring layer 210.

The first semiconductor chip 230 may be mounted in the first trench T1 of the first redistribution wiring layer 210. In some embodiments, the first semiconductor chip 230 may be mounted on a region of the first redistribution wiring layer 210 wherein the first trench T1 is formed. The first semiconductor chip 230 may correspond to the first semiconductor chip 130 of the semiconductor package 100 of FIG. 1. The first semiconductor chip 230 may be mounted on the first redistribution wiring layer 210 through a second connection member 232 and an underfill 234 and may be sealed by a first sealant 236. According to embodiments, the first semiconductor chip 230 may have a structure where a chip pad is directly connected to a redistribution wiring of the first redistribution wiring layer 210 without the second connection member 232. For reference, a structure where the first redistribution wiring layer 210 is first formed and the first semiconductor chip 230 is mounted on the first redistribution wiring layer 210 through the second connection member 232 may be referred to as a chip last structure, and a structure where the first redistribution wiring layer 210 is formed on the first semiconductor chip 230 may be referred to as a chip first structure. A package structure including the first redistribution wiring layer 210 may be referred to as a wafer level package (WLP), and a package structure which includes a fan-out structure through the first redistribution wiring layer 210 may be referred to an FO-WLP.

The first connection member 240 may have a shape such as a through via as illustrated. However, a structure of the first connection member 240 is not limited thereto. For example, like the semiconductor package 100 of FIG. 1, the first connection member 240 may have a structure including a pillar and a solder, or like the semiconductor package 100d of FIG. 5, the first connection member 240 may have a structure including only a solder.

The gap filler 250 may correspond to the gap filler 150 of the first semiconductor package 100 of FIG. 1. Therefore, the gap filler 250 may include or may be formed of a material (for example, NCF, NCP, or SR) which differs from that of the first sealant 236 and may fill a plurality of first connection members 240 disposed between the first redistribution wiring layer 210 and the second redistribution wiring layer 220 outside the first semiconductor chip 230. The gap filler 250 may have a rectangular shape which is long in a second direction (e.g., a y direction). However, the gap filler 250 is not limited thereto and may have a shape of one of the gap fillers 150a to 150c of FIGS. 4A to 4C.

The first sealant 236 may correspond to the first sealant 136 of the first semiconductor package 100 of FIG. 1. The first upper package 260 may be mounted on the second redistribution wiring layer 220 through a third connection member 262. The first upper package 260 may correspond to, for example, the upper package 160 of the first semiconductor package 100 of FIG. 1. Therefore, the first upper package 260 may include at least one second semiconductor chip, and the second semiconductor chip may include, for example, a DRAM chip. However, the second semiconductor chip is not limited to the DRAM chip.

The second upper package 270 may be mounted on the second redistribution wiring layer 220 through a fourth connection member 272. The second upper package 270 may include at least one third semiconductor chip. The third semiconductor chip may include a memory chip which differs from the second semiconductor chip. The third semiconductor chip may include, for example, an SRAM chip or a flash memory chip. However, the third semiconductor chip is not limited to the SRAM chip or the flash memory chip.

Although not shown, an underfill surrounding the third connection member 262 may be disposed between the first upper package 260 and the second redistribution wiring layer 220. An underfill surrounding the fourth connection member 272 may be disposed between the second upper package 270 and the second redistribution wiring layer 220. However, in a case where a second sealant 290 is formed through an MUF process, an underfill may be omitted.

The passive element 280 may be mounted on the second redistribution wiring layer 220. The passive element 280 may include, for example, a two-terminal element such as a resistor element, an inductor element, or a capacitor element. The second sealant 290 may seal the first and second upper packages 260 and 270 and the passive element 280 on the second redistribution wiring layer 220. The second sealant 290 may be formed of EMC like the second sealant 169 of the semiconductor package 100 of FIG. 1. However, a material of the second sealant 290 is not limited to the EMC.

In the semiconductor package 200 according to the present embodiment, the first semiconductor chip 230 may be disposed between the first and second trenches T1 and T2 formed in the first and second redistribution wiring layers 210 and 220, and the gap filler 250 including a material which differs from that of the first sealant 236 may surround the first connection member 240 between the first and second redistribution wiring layers 210 and 220, whereby a fine pitch of the first connection member 240 may be implemented and a total height of a package may decrease. In the semiconductor package 200 according to the present embodiment, a defect such as a short circuit, solder deformation, or non-wetting in the first connection member 240 may be prevented by the gap filler 250. Accordingly, a semiconductor package having a PoP structure with enhanced reliability may be implemented.

FIGS. 11A to 17 are cross-sectional views illustrating a method of manufacturing a semiconductor package having a PoP structure, according to an embodiment. The method of manufacturing a semiconductor package having a PoP structure according to an embodiment will be described below with reference to FIGS. 11A to 17 in conjunction with FIGS. 1 to 3B, and descriptions, which are the same as or similar to descriptions given above with reference to FIGS. 1 to 3B, are briefly given below or omitted.

Figure 11A:
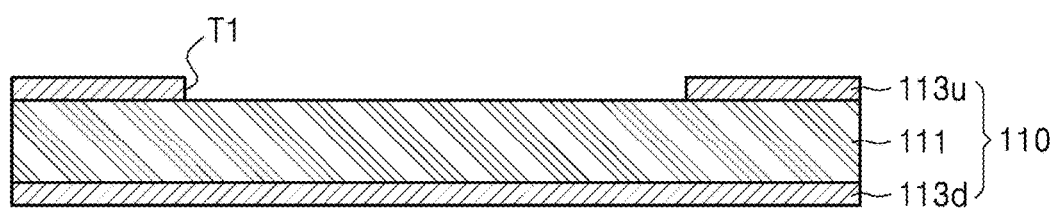
FIGS. 11A to 17 are cross-sectional views and a conceptual view simply illustrating a method of manufacturing a semiconductor package having a PoP structure, according to an embodiment.
Figure 11A:
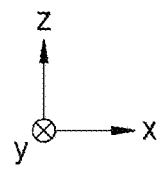
Figure 11B:
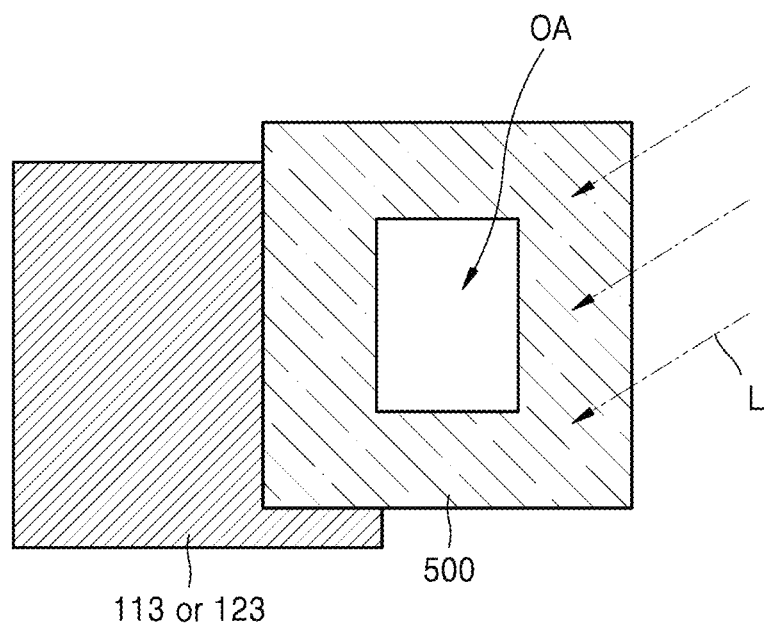

Referring to FIGS. 11A and 11B, the method of manufacturing a semiconductor package having a PoP structure according to an embodiment may include an operation of preparing a first package substrate 110 and a second package substrate 120, an operation of forming a first trench T1 in the first package substrate 110, and an operation of forming a second trench T2 in the second package substrate 120. The first package substrate 110 and the second package substrate 120 may be the same as the first package substrate 110 and the second package substrate 120 of the semiconductor package 100 of FIG. 1 described above.

The first trench T1 and the second trench T2 may be formed through a photolithography process using a photomask 500 as illustrated in FIG. 11B. For example, an exposure process using the photomask 500 including an open region OA corresponding to the first and second trenches T1 and T2 may be performed on passivation layers 113 and 123 of the first and second package substrates 110 and 120, and by removing an exposed region through a development process using a developer, the first and second trenches T1 and T2 may be formed in the first and second package substrates 110 and 120.

Figure 12:
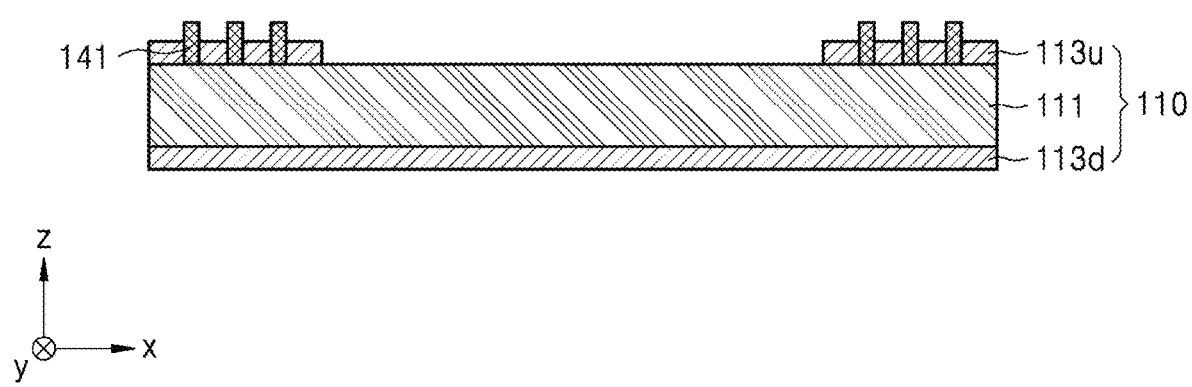

Referring to FIG. 12, a first pillar 141 may be formed on a top surface of the first package substrate 110, and a second pillar 143 and a solder 145 may be formed on a bottom surface of the second package substrate 120. As seen in FIG. 2C, the first pillar 141 may be formed at a portion of an upper passivation layer 113u outside the first trench T1. The second pillar 143 and the solder 145 may be formed at a portion of a lower passivation layer 123d outside the second trench T2. According to embodiments, a solder may be formed on the first pillar 141 instead of being formed on the second pillar 143.

Figure 13:
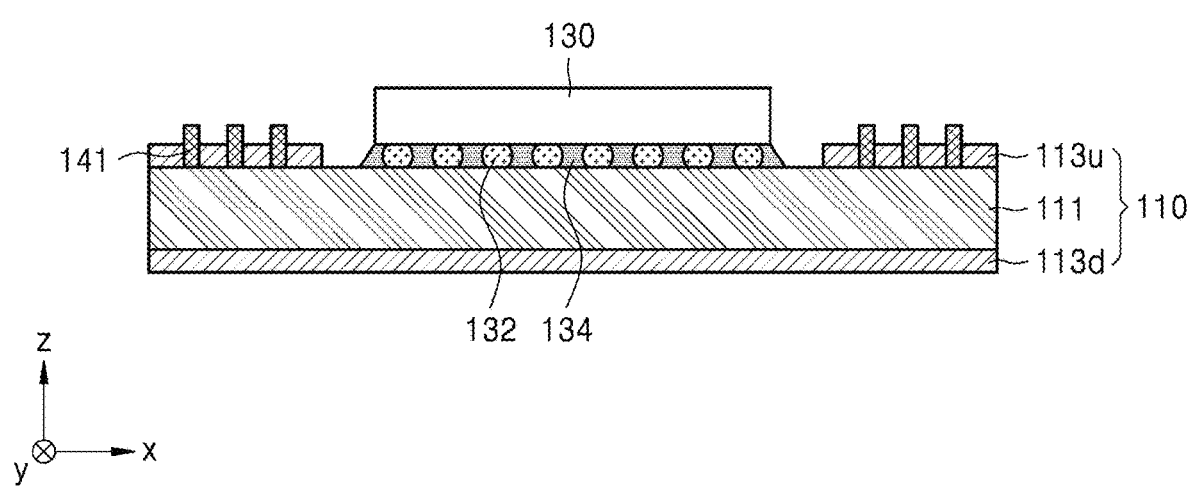

Referring to FIG. 13, a first semiconductor chip 130 may be mounted in the first trench T1 of a top surface of the first package substrate 110. For example, the first semiconductor chip 130 may be mounted on a region of the first package substrate 110 where the first trench T1 is formed. The first semiconductor chip 130 may be mounted on the first package substrate 110 through a third connection member 132 and an underfill 134. As described above, in a case where a first sealant 136 is formed through an MUF process, the underfill 134 may be omitted. The first semiconductor chip 130 may be the same as the first semiconductor chip 130 of the semiconductor package 100 of FIG. 1 described above.

Figure 14:
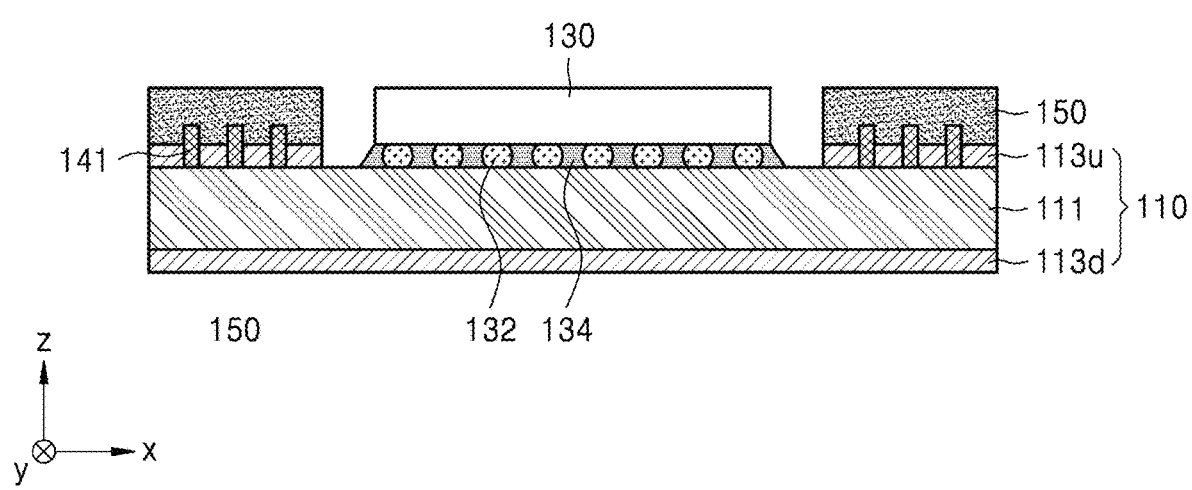

Referring to FIG. 14, a gap filler 150 may be formed at a portion of an upper passivation layer 113u of the top surface of the first package substrate 110. The gap filler 150, as illustrated in FIG. 3A, may have a rectangular shape which is long in a second direction (e.g., a y direction). However, the gap filler 150 is not limited thereto and may have a shape of one of the gap fillers 150a to 150c of FIGS. 4A to 4C.

The gap filler 150 may be formed to cover the first pillar 141 disposed in the upper passivation layer 113u. The gap filler 150 may be formed on the second package substrate 120 instead of the first package substrate 110. In this case, the gap filler 150 may be formed on a lower passivation layer 123d of the second package substrate 120 and may be formed to cover the second pillar 143 and the solder 145 each disposed in the lower passivation layer 123d.

Figure 15:
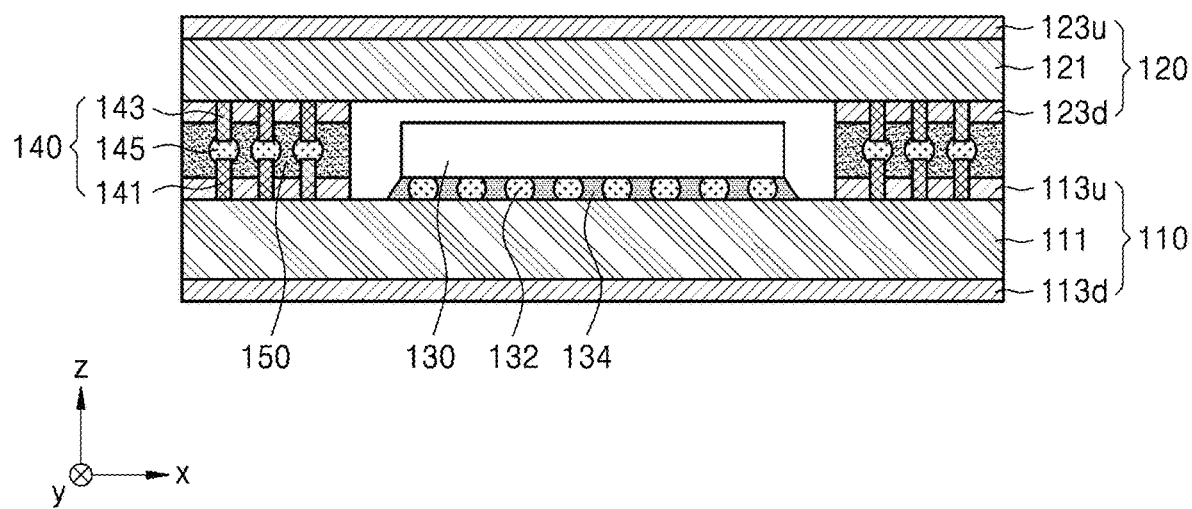

Referring to FIG. 15, the second package substrate 120 may be stacked on the first package substrate 110 through a TCB process. The first pillar 141 and the second pillar 143 may be coupled to each other through the solder 145 by stacking the second package substrate 120 on the first package substrate 110 to form a first connection member 140. For example, the first connection member 140 may include the first pillar 141, the second pillar 142, and the solder 145 disposed therebetween. As described above, the flow of the solder 145 may be minimized by the gap filler 150 in the TCB process, thereby preventing defects such as a short circuit, solder deformation, and non-wetting.

Figure 16:
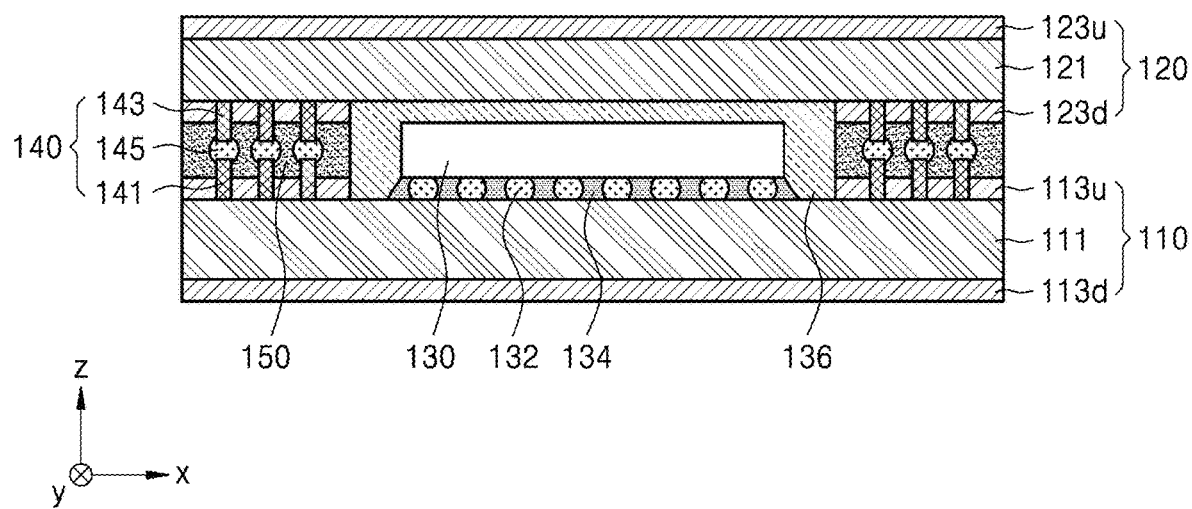

Referring to FIG. 16, the first semiconductor chip 130 may be sealed by injecting the first sealant 136 (for example, an EMC) through an injection path IP (see, FIGS. 3A and 3B). The first sealant 136 may fill the first and second trenches T1 and T2 and may cover a top surface and a side surface of the first semiconductor chip 130 and the underfill 134. As described above, the gap filler 150 may prevent the first sealant 136 from penetrating (i.e., flowing into) spaces between the first connection members 140 in a process of injecting the first sealant 136, thereby preventing defects such as a short circuit, solder deformation, and non-wetting from occurring in the first connection members 140.

Figure 17:
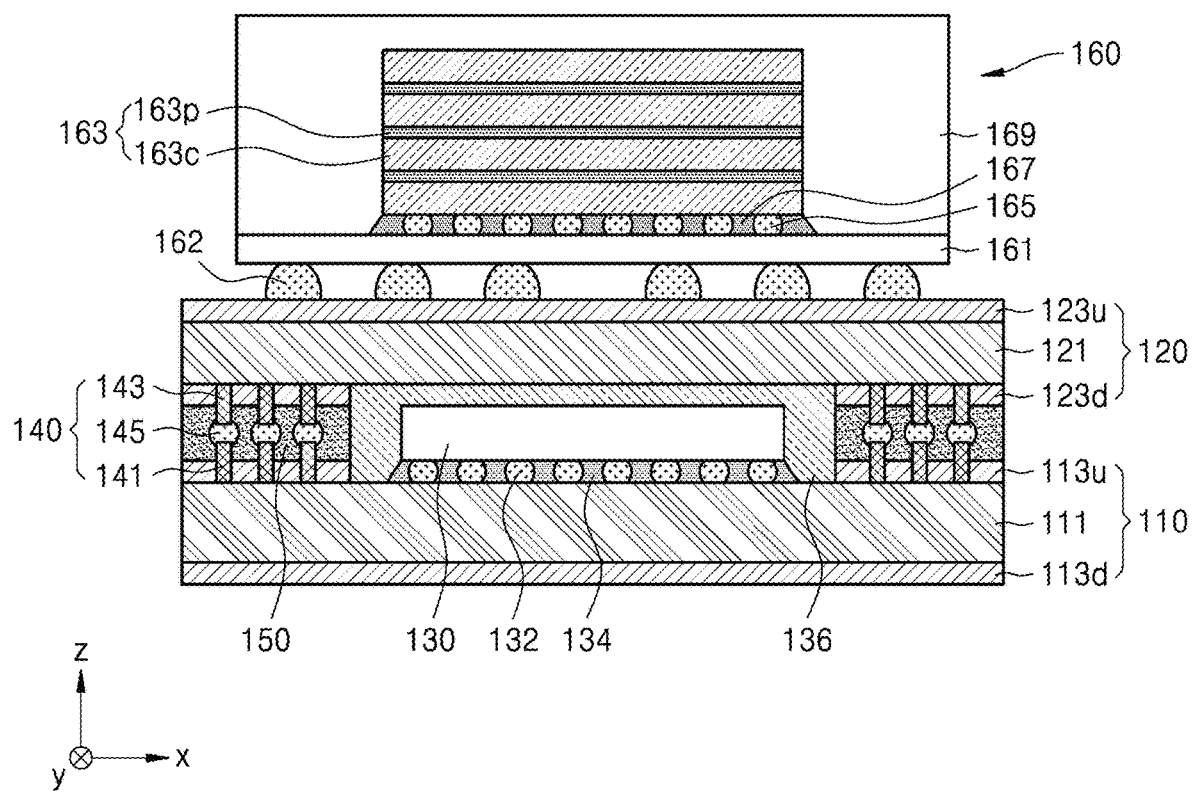

Referring to FIG. 17, an upper package 160 may be mounted on a second package substrate 120 through a second connection member 162. The upper package 160 may be the same as the upper package 160 of the semiconductor package 100 of FIG. 1 described above. Subsequently, an external connection member 115 may be disposed on a bottom surface of the first package substrate 110, and thus, the semiconductor package 100 of FIG. 1 may be finished.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a first package substrate including a first body layer and a first passivation layer on a top surface of the first body layer;
   a first semiconductor chip mounted on the first package substrate;
   a second package substrate disposed on the first package substrate and the first semiconductor chip, the second package substrate including a second body layer and a second passivation layer on a bottom surface of the second body layer;

a plurality of first connection members disposed on the first package substrate to electrically connect the first package substrate to the second package substrate; and
a gap filler filling a space between the first package substrate and the second package substrate and surrounding at least some of portions of the plurality of first connection members,
wherein the first package substrate comprises a first trench formed by removing a center portion of the first passivation layer,
wherein the second package substrate comprises a second trench formed by removing a center portion of the second passivation layer, and
wherein the first semiconductor chip is disposed in a space between the first trench and the second trench.

2. The semiconductor device of claim 1, further comprising:
an epoxy molding compound (EMC) filling at least a portion of each of the first trench and the second trench and covering the first semiconductor chip,
wherein the gap filler comprises a material which differs from the EMC.

3. The semiconductor device of claim 1,
wherein each of the plurality of first connection members comprises:
a first pillar connected to the first package substrate;
a second pillar connected to the second package substrate; and
a solder connecting the first pillar to the second pillar.

4. The semiconductor device of claim 1,
wherein each of the plurality of first connection members comprises:
a solder ball directly connecting the first package substrate to the second package substrate.

5. The semiconductor device of claim 1,
wherein the gap filler comprises one of a nonconductive film (NCF), a nonconductive paste (NCP), and solder resist (SR).

6. The semiconductor device of claim 1,
wherein the first passivation layer and the second passivation layer comprise solder resist (SR), and
wherein each of the first passivation layer and the second passivation layer is formed in a single layer.

7. The semiconductor device of claim 1,
wherein the first passivation layer and the second passivation layer comprise solder resist (SR),
wherein each of the first passivation layer and the second passivation layer is formed in a multi-layer structure, and
wherein each of the first trench and the second trench is formed by removing all of the multi-layer structure or is formed by removing a portion of the multi-layer structure.

8. The semiconductor device of claim 1,
wherein the gap filler is disposed at opposite sides of the first semiconductor chip,
wherein the opposite sides of the first semiconductor chip are spaced apart from each other in a first direction,
wherein the gap filler contacts the opposite sides extending in a second direction that is vertical to the first direction, and
wherein the first direction and the second direction are parallel to an upper surface of the first semiconductor chip.

9. The semiconductor device of claim 8,
wherein, when viewed in a plan view, a shape of the gap filler is one of:
a first shape of a rectangle,
a second shape including opposite end portions spaced apart from each other in the second direction, and a center portion disposed in a space between the opposite end portions, wherein a width, measured in the first direction, of each end portion of the opposite end portions is greater than a width, measured in the first direction, of the center portion,
a third shape including a first end portion and a second end portion, wherein the first end portion is spaced apart from the second end portion in the second direction, and a width, measured in the first direction, of the first end portion is greater than a width, measured in the first direction, of the second portion, and
a fourth shape of a lattice shape defining a plurality of spaces in which the plurality of first connection members are disposed.

10. The semiconductor device of claim 1,
wherein the gap filler is configured to maintain a first gap between the first semiconductor chip and the second package substrate, and
wherein the first gap is filled with an epoxy molding compound (EMC).

11. The semiconductor device of claim 1, further comprising:
an upper package mounted on the second package substrate,
wherein the upper package comprises an upper substrate and a second semiconductor chip mounted on the upper substrate.

12. The semiconductor device of claim 11,
wherein the second package substrate comprises a silicon interposer, a panel interposer, or a glass interposer,
wherein the first semiconductor chip comprises a logic chip,
wherein the second semiconductor chip comprises a memory chip, and
wherein the upper package further comprises a third semiconductor chip which is stacked on the second semiconductor chip.

13. A semiconductor device comprising:
a first package substrate including a first body layer, a first upper passivation layer on a top surface of the first body layer, and a first lower passivation layer on a bottom surface of the first body layer, and a first trench formed in a center portion of the first upper passivation layer on the top surface of the first body layer;
a second package substrate disposed on the first package substrate, the second package substrate including a second body layer, a second upper passivation layer on a top surface of the second body layer, and a second lower passivation layer on a bottom surface of the second body layer, and a second trench formed in a center portion of the second lower passivation layer on the bottom surface of the second body layer;
a first semiconductor chip mounted on a top surface of the first package substrate and disposed in a space between a first region of the first package substrate where the first trench is formed and a second region of the second package substrate where the second trench is formed;
an upper package mounted on a top surface of the second package substrate, the upper package including a second semiconductor chip;
an epoxy molding compound (EMC) covering the first semiconductor chip and filling at least a portion of each of the first trench and the second trench; and
a gap filler including a material which differs from the EMC and filling at least a portion between the first upper passivation layer of the first package substrate and the second lower passivation layer of the second package substrate.

14. The semiconductor device of claim 13, further comprising:
a first connection member disposed on the first package substrate to electrically connect the first package substrate to the second package substrate,
wherein the first connection member comprises a first pillar connected to the first package substrate, a second pillar connected to the second package substrate, and a fine solder connecting the first pillar to the second pillar.

15. The semiconductor device of claim 13, further comprising:
a plurality of first connection members disposed on the first package substrate to electrically connect the first package substrate to the second package substrate,
wherein the gap filler comprises one of a nonconductive film (NCF), a nonconductive paste (NCP), and solder resist (SR) and surrounds at least some of portions of the plurality of first connection members.

16. The semiconductor device of claim 13,
wherein each of the first upper passivation layer, the first lower passivation layer, the second upper passivation layer, and the second lower passivation layer comprises solder resist (SR), and is formed in a single layer or multi-layer structure.

17. The semiconductor device of claim 13, further comprising:
a plurality of first connection members disposed on the first package substrate to electrically connect the first package substrate to the second package substrate,
wherein, when viewed in a plan view, the gap filler is disposed at opposite sides of the first semiconductor chip,
wherein the opposite sides of the first semiconductor chip are spaced apart from each other in a first direction, and wherein the gap filler extends along the opposite sides extending in a second direction vertical to the first direction.

18. The semiconductor device of claim 13,
wherein the upper package further comprises:
an upper substrate on which the second semiconductor chip is mounted;
a sealant sealing the second semiconductor chip; and
a third semiconductor chip mounted on the upper substrate, and
wherein the second and third semiconductor chips are stacked on each other.

19. The semiconductor device of claim 13,
wherein the first trench and the second trench are configured to accommodate the first semiconductor chip to reduce a thickness of the semiconductor device.

20. The semiconductor device of claim 17,
wherein, when viewed in a plan view, a shape of the gap filler is one of:
a first shape of a rectangle,
a second shape including opposite end portions spaced apart from each other in the second direction, and a center portion disposed in a space between the opposite end portions, wherein a width, measured in the first direction, of each end portion of the opposite end portions is greater than a width, measured in the first direction, of the center portion,
a third shape including a first end portion and a second end portion, wherein the first end portion is spaced apart from the second end portion in the second direction, and a width, measured in the first direction, of the first end portion is greater than a width, measured in the first direction, of the second portion, and
a fourth shape of a lattice shape defining a plurality of spaces in which a plurality of first connection members are disposed.

* * * * *